(12) United States Patent
Ishida et al.

(10) Patent No.: US 7,199,469 B2
(45) Date of Patent: Apr. 3, 2007

(54) SEMICONDUCTOR DEVICE HAVING STACKED SEMICONDUCTOR CHIPS SEALED WITH A RESIN SEAL MEMBER

(75) Inventors: Toru Ishida, Tama (JP); Tetsuharu Urawa, Kodaira (JP); Fujio Ito, Hanno (JP); Tomoo Matsuzawa, Tokyo (JP); Kazunari Suzuki, Tokyo (JP); Akihiko Kameoka, Ogose (JP); Hiromichi Suzuki, Tokyo (JP); Takuji Ide, Higashimurayama (JP)

(73) Assignees: Renesas Technology Corp., Tokyo (JP); Hitachi ULSI Systems Co., Ltd., Tokyo (JP); Hitachi Hokkai Semiconductor, Ltd., Hokkaido (JP)

(*) Notice: Subject to any disclaimer, the term of this patent is extended or adjusted under 35 U.S.C. 154(b) by 563 days.

(21) Appl. No.: 09/964,484

(22) Filed: Sep. 28, 2001

(65) Prior Publication Data

US 2002/0043717 A1    Apr. 18, 2002

(30) Foreign Application Priority Data

Oct. 16, 2000   (JP)   ............................. 2000-315785

(51) Int. Cl.
*H01L 23/48*    (2006.01)
*H01L 23/495*   (2006.01)
*H01L 23/50*    (2006.01)
*H01L 25/18*    (2006.01)
*H01L 25/065*   (2006.01)

(52) U.S. Cl. .............................. 257/724; 257/E23.052; 257/E23.079; 257/E25.013; 257/686; 257/685; 257/823; 257/784; 257/777; 257/728; 257/725; 257/786; 257/698

(58) Field of Classification Search ........ 257/723–725, 257/646, 676, 784, 692, 696, 746, 777, 728, 257/604, E23.052, E23.079, E25.013, 698, 257/684–686, 786, 796
See application file for complete search history.

(56) References Cited

U.S. PATENT DOCUMENTS

| | | | | |
|---|---|---|---|---|
| 5,458,617 A | * | 10/1995 | Bystrom | 438/51 |
| 5,777,345 A | * | 7/1998 | Loder et al. | 257/777 |
| 6,087,222 A | * | 7/2000 | Jung Lin et al. | 438/289 |
| 6,133,637 A | * | 10/2000 | Hikita et al. | 257/777 |
| 6,261,865 B1 | * | 7/2001 | Akram | 438/111 |
| 6,291,881 B1 | * | 9/2001 | Yang | 257/723 |
| 6,307,257 B1 | * | 10/2001 | Huang et al. | 257/676 |
| 6,353,265 B1 | * | 3/2002 | Michii | 257/777 |
| 6,410,987 B1 | * | 6/2002 | Kanemoto et al. | 257/777 |
| 6,433,421 B2 | * | 8/2002 | Masuda et al. | 257/723 |
| 6,437,449 B1 | * | 8/2002 | Foster | 257/777 |

(Continued)

FOREIGN PATENT DOCUMENTS

| | | |
|---|---|---|
| JP | 2-5455 | 1/1990 |
| JP | 5-343609 | 12/1993 |

*Primary Examiner*—Alexander Oscar Williams
(74) *Attorney, Agent, or Firm*—Mattingly, Stanger, Malur & Brundidge, P.C.

(57) ABSTRACT

The cost of a semiconductor device is to be reduced. An electrical connection between a first semiconductor chip and a second semiconductor chip stacked on the first semiconductor chip is made through an inner lead portion of a lead disposed at a position around the first semiconductor chip and two bonding wires.

4 Claims, 21 Drawing Sheets

U.S. PATENT DOCUMENTS

| | | | |
|---|---|---|---|
| 6,441,495 B1* | 8/2002 | Oka et al. | 257/777 |
| 6,458,625 B2* | 10/2002 | Akram | 438/111 |
| 6,483,181 B2* | 11/2002 | Chang et al. | 257/686 |
| 6,552,416 B1* | 4/2003 | Foster | 257/666 |
| 6,559,526 B2* | 5/2003 | Lee et al. | 257/676 |
| 6,573,567 B1* | 6/2003 | Nishizawa et al. | 257/358 |
| 6,580,164 B1* | 6/2003 | Ohie | 257/690 |
| 6,603,072 B1* | 8/2003 | Foster et al. | 174/52.4 |
| 6,700,794 B2* | 3/2004 | Vinson et al. | 361/782 |
| 6,744,121 B2* | 6/2004 | Chang et al. | 257/668 |
| 6,759,307 B1* | 7/2004 | Yang | 438/455 |
| 6,841,858 B2* | 1/2005 | Shim et al. | 257/676 |
| 2001/0023994 A1* | 9/2001 | Oka | 257/782 |
| 2001/0040281 A1* | 11/2001 | Butler | 257/686 |
| 2001/0054759 A1* | 12/2001 | Nishiura | 257/686 |
| 2002/0017720 A1* | 2/2002 | Nishizawa et al. | 257/723 |
| 2002/0024146 A1* | 2/2002 | Furusawa | 257/777 |
| 2002/0027266 A1* | 3/2002 | Wada et al. | 257/666 |
| 2002/0030270 A1* | 3/2002 | Nishizawa et al. | 257/724 |
| 2002/0084519 A1* | 7/2002 | Choi et al. | 257/678 |
| 2002/0088633 A1* | 7/2002 | Kong et al. | 174/52.2 |
| 2002/0102763 A1* | 8/2002 | Masuda et al. | 438/64 |
| 2002/0109222 A1* | 8/2002 | Lai et al. | 257/724 |
| 2002/0109237 A1* | 8/2002 | Oka | 257/777 |
| 2002/0145190 A1* | 10/2002 | Fernandez | 257/686 |
| 2002/0153599 A1* | 10/2002 | Chang et al. | 257/676 |
| 2002/0158316 A1* | 10/2002 | Lee et al. | 257/676 |
| 2002/0180020 A1* | 12/2002 | Lin et al. | 257/686 |
| 2002/0180021 A1* | 12/2002 | Lin et al. | 257/686 |
| 2003/0006490 A1* | 1/2003 | Kawaishi | 257/678 |
| 2003/0020177 A1* | 1/2003 | Oka | 257/777 |
| 2003/0038356 A1* | 2/2003 | Derderian | 257/686 |
| 2003/0057566 A1* | 3/2003 | Huang et al. | 257/777 |
| 2003/0137042 A1* | 7/2003 | Mess et al. | 257/686 |
| 2004/0033673 A1* | 2/2004 | Cobbley et al. | 438/455 |

* cited by examiner

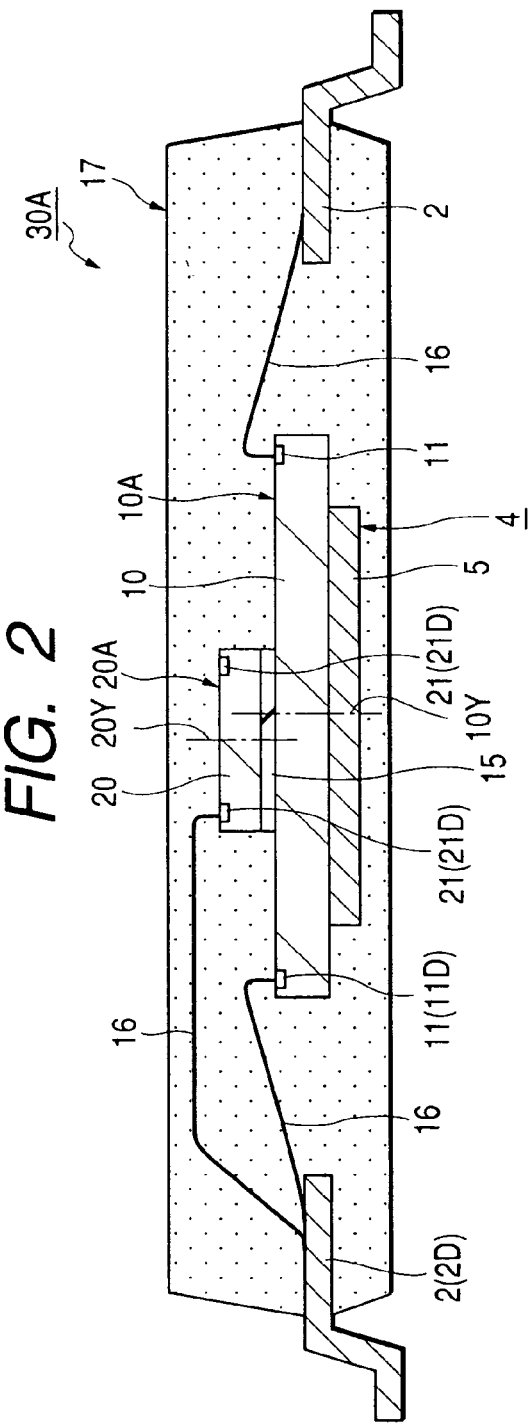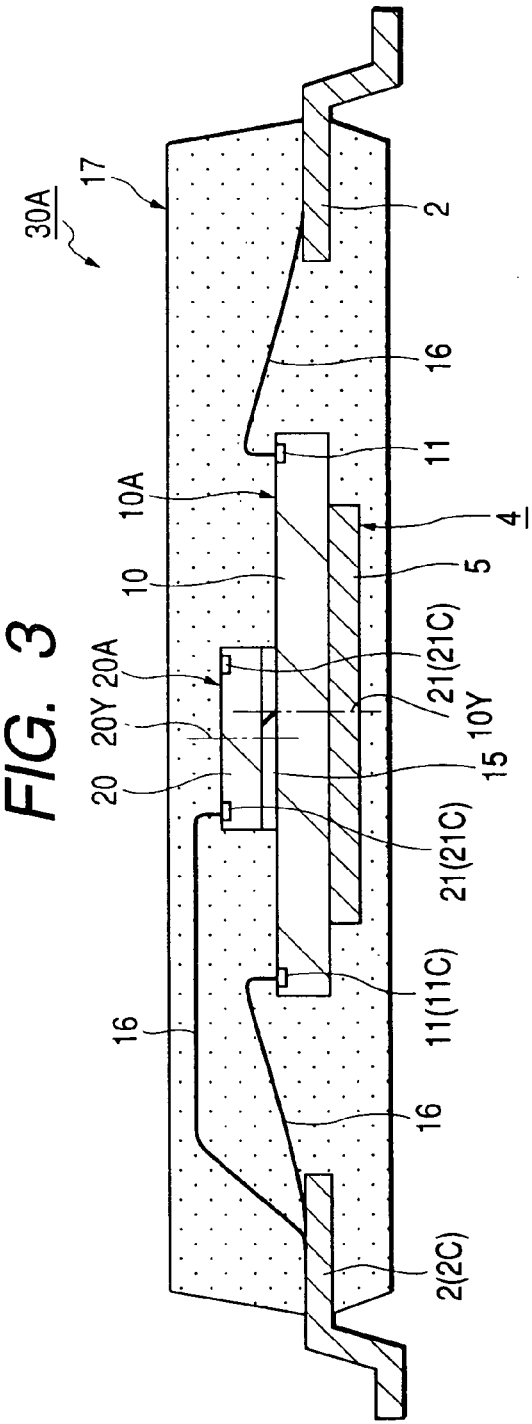

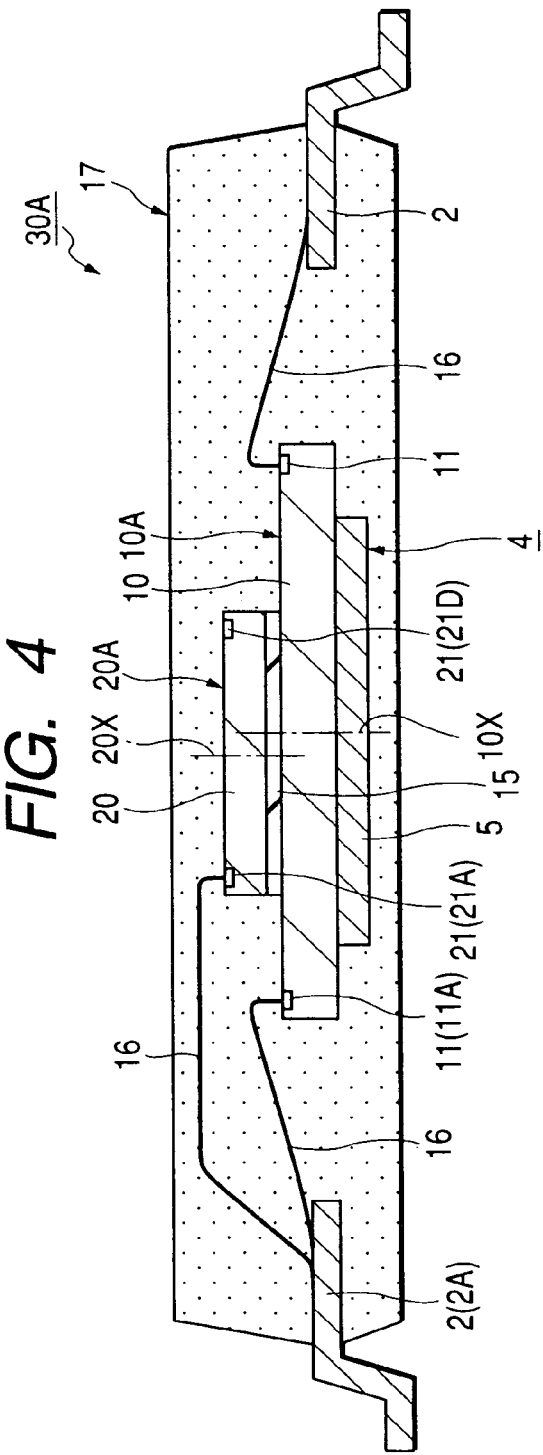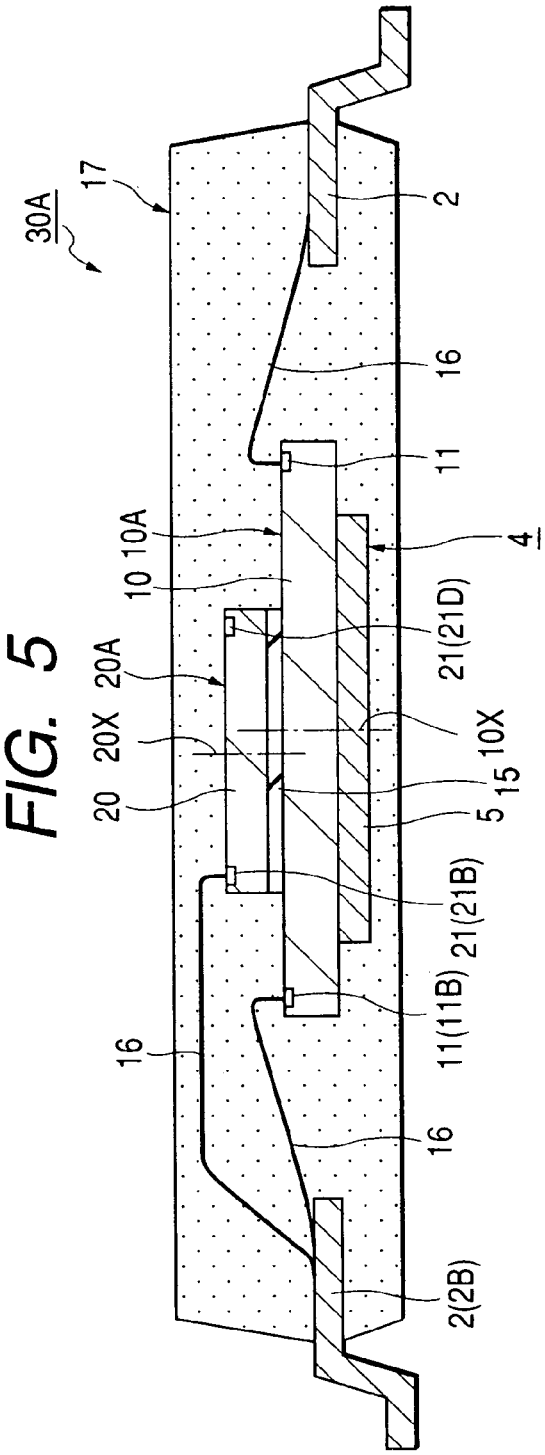

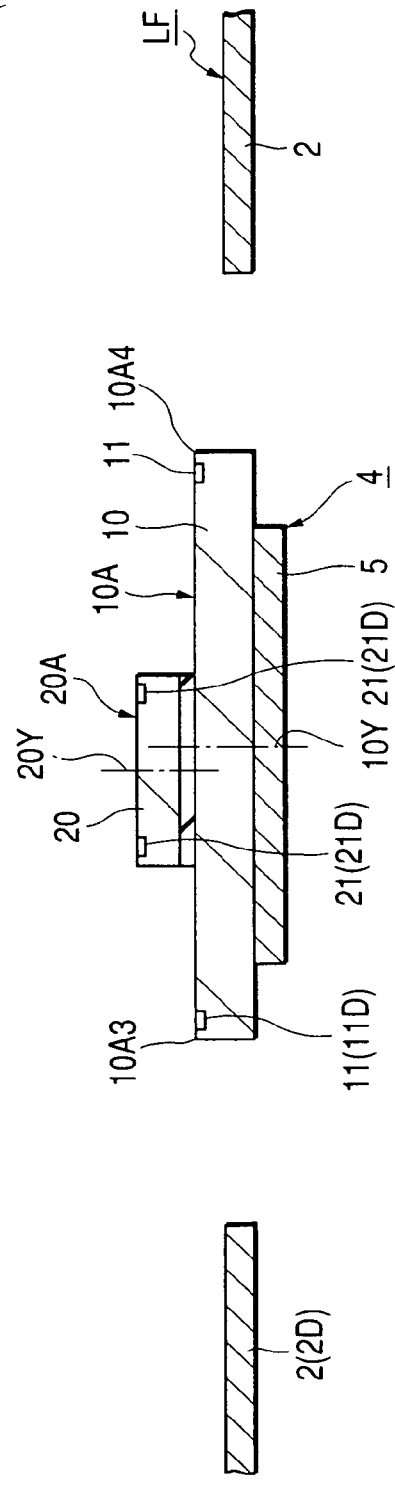
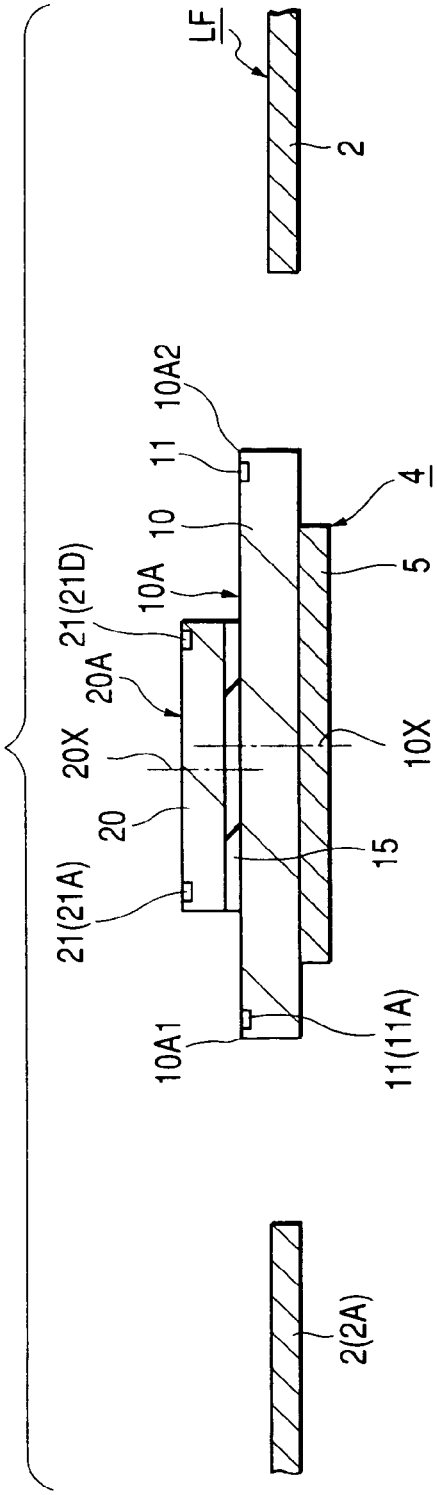
FIG. 13(A)
FIG. 13(B)

SEMICONDUCTOR DEVICE HAVING STACKED SEMICONDUCTOR CHIPS SEALED WITH A RESIN SEAL MEMBER

BACKGROUND OF THE INVENTION

The present invention relates to a semiconductor device. Particularly, the invention is concerned with a technique effective in its application to a semiconductor device wherein two semiconductor chips are stacked and sealed with a single resin seal member.

A semiconductor device called MCP (Multi Chip Package) is known. Various structures of MCP type semiconductor devices have been developed and commercialized, among which one comprising two semiconductor chips stacked and incorporated in a single package is most popular. For example, in Japanese Unexamined Patent Publication No. Hei 2(1990)- 5455 (prior art literature 1) there is disclosed an MCP type semiconductor device wherein a chip for EEPROM (Electrically Erasable Programmable Read Only Memory) which contains a non-volatile memory unit as a memory chip is stacked on a chip for a microcomputer which contains a processor unit adapted to operate in accordance with a program, and these two chips are sealed with a single resin seal member. In the prior art literature 1 is disclosed a technique wherein a chip for a microcomputer and leads arranged around the microcomputer chip are electrically connected with each other by bonding wires, while an electrical connection between the microcomputer chip and the EEPROM chip is made by bumps.

In Japanese Unexamined Patent Publication No. Hei 5(1993)-343609 (prior art literature 2) is disclosed an MCP type semiconductor device wherein a bipolar chip which contains a circuit consisting mainly of a bipolar transistor is stacked on a CMOS (Complementary MOS) chip which contains a circuit consisting mainly of a MOSFET (Metal Oxide Semiconductor Field Effect Transistor) and these two chips are sealed with a single resin seal member. In the prior art literature 2 is disclosed a technique wherein an electrical connection between the CMOS chip and leads arranged around the CMOS chip is made using bonding wires, and an electrical connection between the CMOS chip and the bipolar chip is made using bonding wires.

SUMMARY OF THE INVENTION

There is an increasing demand for a semiconductor device having a microcomputer chip and an EEPROM chip both incorporated in a single package. In the course of developing a semiconductor device wherein an EEPROM chip is stacked on a microcomputer chip and these two chips are sealed with a single resin seal member, the present inventors found out the following problems.

(1) In case of incorporating a microcomputer chip and an EEPROM chip into a single package, it is necessary to make an electrical connection between both chips. By providing leads for the microcomputer for electrical connection with bonding pads of the microcomputer chip and also providing leads for the EEPROM for electrical connection with bonding pads of the EEPROM chip and by electrically connecting the microcomputer leads and the EEPROM leads with each other using wiring lines on a mounting substrate which is used at the time of mounting the semiconductor device, it is possible to make an electrical connection between the microcomputer chip and the EEPROM chip. In this case, however, it is necessary to newly develop a lead frame for each type of a microcomputer chip, thus resulting in an increase in the manufacturing cost of the semiconductor device.

On the other hand, in the prior art literature 1 is disclosed a method wherein bonding pads for electrical connection with leads are formed on peripheral edges of a circuit-formed surface of a chip for a microcomputer, while in a central area of the circuit-formed surface of the microcomputer chip are formed bonding pads for electrical connection with bonding pads of a chip for an EEPROM, and there is made an electrical connection between the two. In this case, a lead frame developed in conformity with the microcomputer chip can be used as it is and hence it is not necessary to newly develop a lead frame for each type of a microcomputer chip. But it is necessary to develop a microcomputer chip provided with EEPROM bonding pads for each type of a microcomputer chip, so that the manufacturing cost of the semiconductor device increases.

(2) In the prior art literature 2 is disclosed a method wherein an electrical connection between bonding pads for leads formed on peripheral edges of a circuit-formed surface of a CMOS chip and leads disposed along the periphery of the CMOS chip is made using bonding wires, and an electrical connection between bonding pads formed on a circuit-formed surface of a bipolar chip and a bipolar bonding pads formed in a central area of the circuit-formed surface of the CMOS chip is made using bonding wires.

In the wire bonding process, the position of a semiconductor chip is checked using a CCD (Charge Coupled Device) camera, then the positions of bonding pads are recognized on the basis of such position data, and thereafter wire bonding is performed. In case of two chips being stacked, the position of an upper chip is detected by bringing an optical lens of the CCD camera into focus with a lower chip. Therefore, if the upper chip is thick, the focusing range exceeds the depth of field of the optical lens, so that the image of the upper chip blurs. In the event the upper chip image blurs, there occurs an error in the detection of the upper chip position, thus causing an error also in the detection of bonding pad positions. Consequently, there occurs a connection defect between bonding pads of the upper chip and bonding wires, with consequent lowering in yield of the semiconductor device. This problem becomes more and more conspicuous as the external size of each bonding pad becomes smaller.

It is an object of the present invention to provide a technique capable of reducing the cost of a semiconductor device.

It is another object of the present invention to provide a technique capable of improving the manufacturing yield of a semiconductor device.

The above and other objects and novel features of the present invention will become apparent from the following description and the accompanying drawings.

The following are brief descriptions of typical inventions disclosed herein.

(1) A semiconductor device comprising:

a first semiconductor chip having on one main surface thereof a control circuit, a first bonding pad, and a plurality of second bonding pads;

a second semiconductor chip having on one main surface thereof a memory circuit and a third bonding pad and disposed on the one main surface of the first semiconductor chip, the memory circuit being controlled in accordance with a control signal generated in the control circuit on the first semiconductor chip;

a first lead having an inner lead portion and an outer lead portion integral with the inner lead portion, the inner lead portion being disposed at a position around the first semiconductor chip;

a plurality of second leads each having an inner lead portion and an outer lead portion integral with the inner lead portion, the inner lead portion being disposed at a position around the first semiconductor chip;

a first bonding wire for connecting the first bonding pad on the first semiconductor chip with the inner lead portion of the first lead;

a plurality of second bonding wires for connecting the plural second bonding pads on the first semiconductor chip with the inner lead portions of the plural second leads;

a third bonding wire for connecting the third bonding pad on the second semiconductor chip with the inner lead portion of the first lead; and a resin seal member for sealing the first and second semiconductor chips, the first, second and third bonding wires, and the inner lead portions of the first and second leads, wherein the control signal generated in the control circuit is outputted from the first bonding pad on the first semiconductor chip and is inputted to the third bonding pad on the second semiconductor chip through the first bonding wire, the first lead and the third bonding wire.

(2) In the semiconductor device described in the above means (1), the second semiconductor chip is formed in a plane size smaller than that of the first semiconductor chip.

(3) In the semiconductor device described in the above means (1), another main surface of the second semiconductor chip opposed to the one main surface thereof is disposed on the one main surface of the first semiconductor chip in an opposed relation to the one main surface of the first semiconductor chip.

(4) In the semiconductor device described in the above means (1), the first and third bonding wires are connected to one and same surface of the first lead.

(5) A semiconductor device comprising:

a first semiconductor chip having first and second main surfaces opposed to each other, with a plurality of bonding pads being formed on the first main surface;

a second semiconductor chip having first and second main surfaces opposed to each other, with a plurality of bonding pads being formed on the first main surface, the second main surface being disposed on the first semiconductor chip in an opposed relation to the first main surface of the first semiconductor chip, the second semiconductor chip having a plane size smaller than the first semiconductor chip;

a plurality of leads each having an inner lead portion and an outer lead portion integral with the inner lead portion, the inner lead portion being disposed at a position around the first semiconductor chip;

a plurality of bonding wires for connecting the plural bonding pads on the first and second semiconductor chips with the inner lead portions of the plural leads; and a resin seal member for sealing the first and second semiconductor chips, the inner lead portions of the plural leads, and the plural bonding wires, wherein the second semiconductor chip is thinner than the fist semiconductor chip.

(6) In the semiconductor device described in the above means (5), the second semiconductor chip is bonded to the first main surface of the first semiconductor chip through an adhesive layer.

(7) In the semiconductor device described in the above means (6), the adhesive layer is formed by a resin film.

(8) In the semiconductor device described in the above means (6), the distance from the first main surface of the first semiconductor chip to the second main surface of the second semiconductor chip is smaller than the thickness of the first semiconductor chip.

BRIEF DESCRIPTION OF THE DRAWINGS

FIG. 2 is a schematic sectional view substantially taken along line a—a in FIG. 1;

FIG. 3 is a schematic sectional view substantially taken along line b—b in FIG. 1;

FIG. 4 is a schematic sectional view substantially taken along line c—c in FIG. 1;

FIG. 5 is a schematic sectional view substantially taken along line d—d in FIG. 1;

FIG. 13 is a schematic sectional view for explaining the chip bonding process, in which (A) is a schematic sectional view for explaining the chip bonding process, in which (A) is a schematic sectional view at a position approximately corresponding to line a—a in FIG. 1 and (B) is a schematic sectional view at a position approximately corresponding to line c—c in FIG. 1;

DETAILED DESCRIPTION OF PREFERRED EMBODIMENTS

Figure 1:
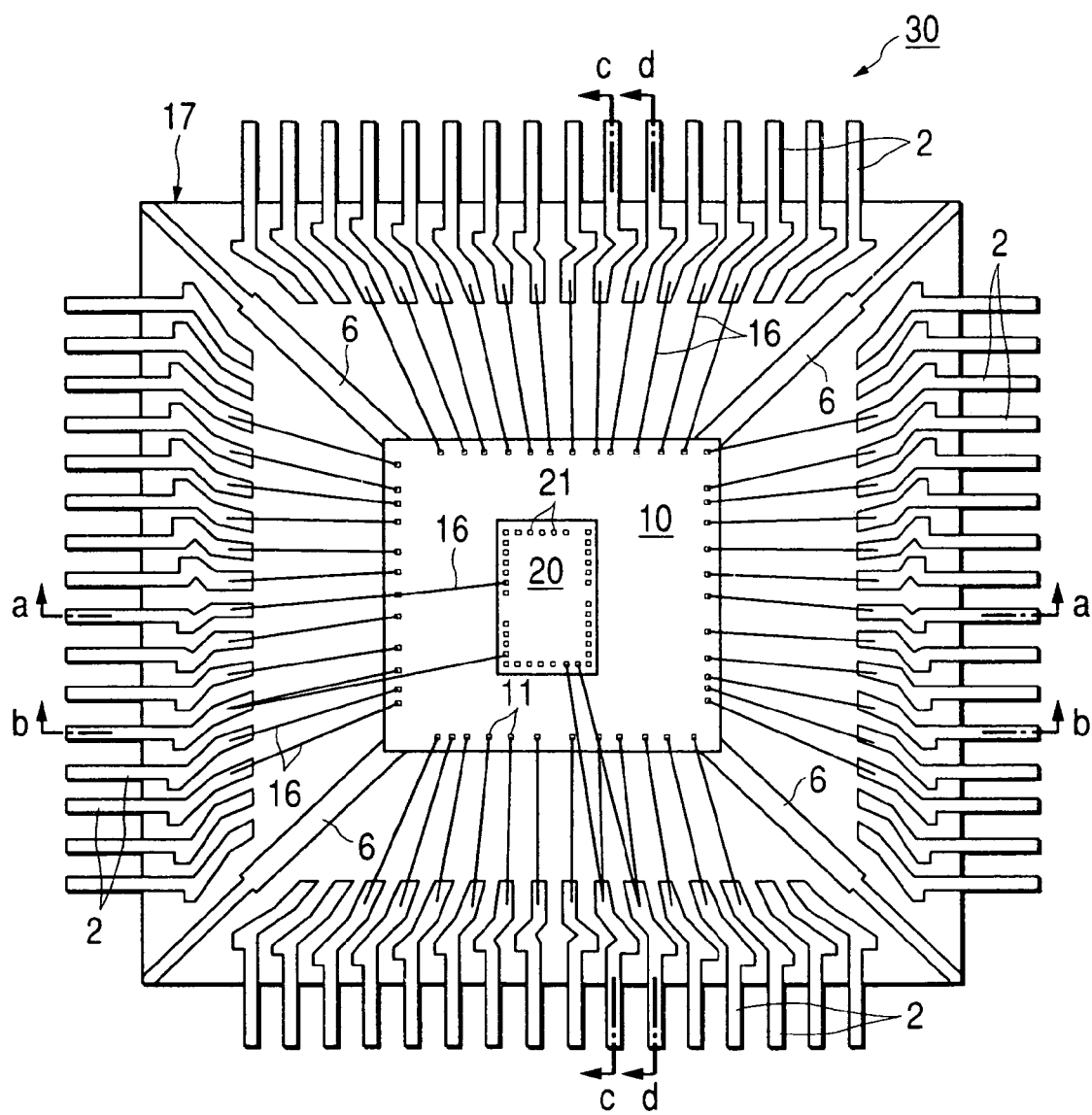
FIG. 1 is a schematic plan view of a semiconductor device according to the first embodiment of the present invention, with an upper portion of a resin seal member removed.

The present invention will be described hereinunder by way of embodiments thereof in which the invention is applied to a QFP (Quad Flatpack Package) type semiconductor device. In the drawings for illustrating the embodiments, components having the same functions are identified by the same reference numerals, and repeated explanations thereof will be omitted.

(First Embodiment)

Figure 6:
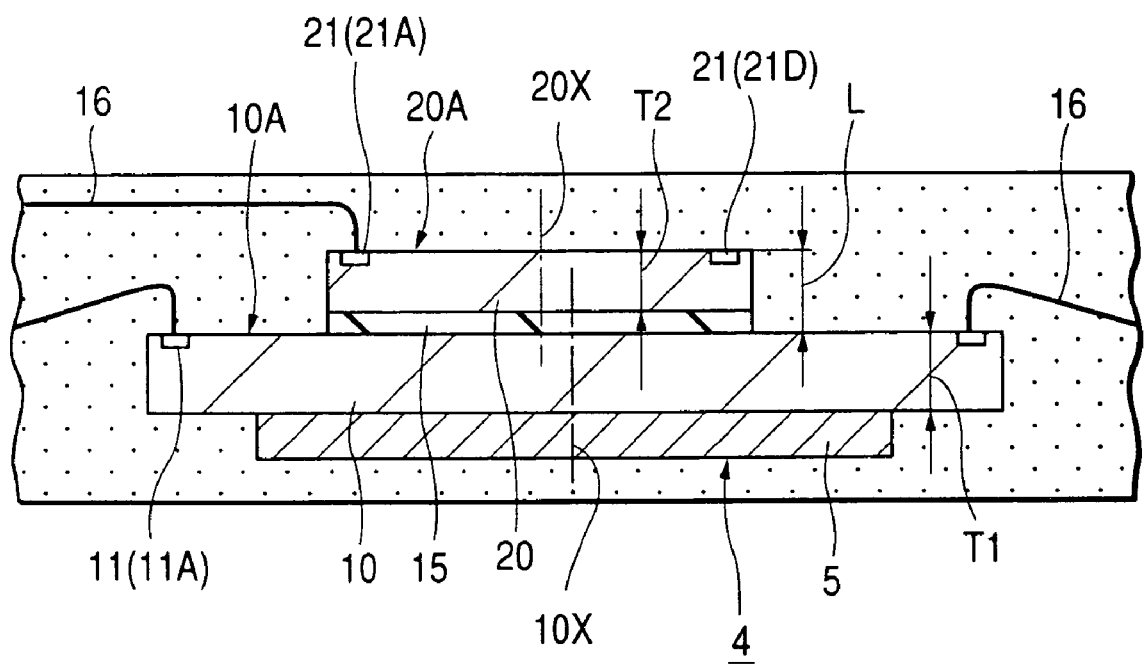
FIG. 6 is a partially enlarged, schematic sectional view of FIG. 4.
Figure 7:
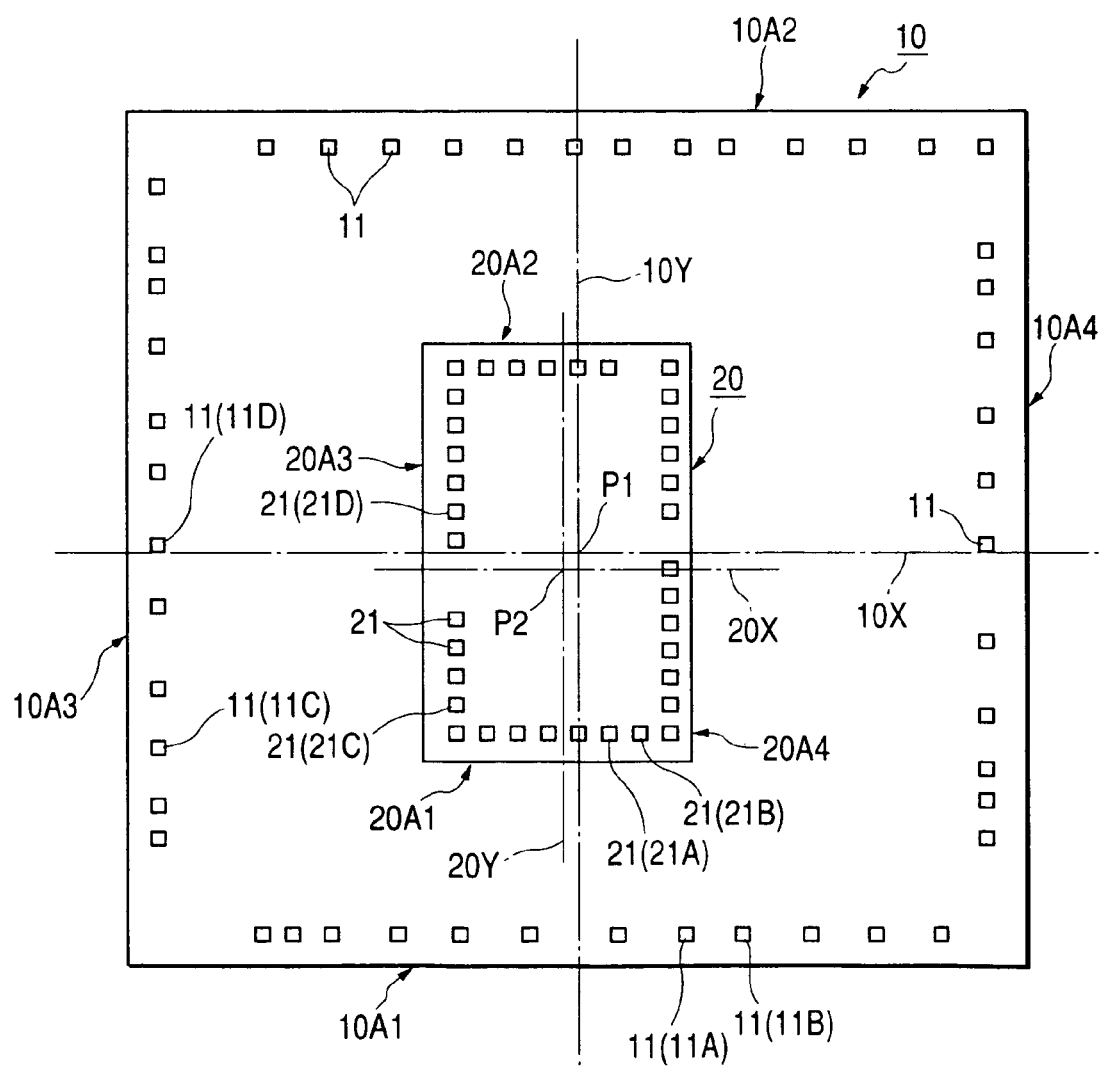
FIG. 7 is a schematic plan view showing a stacked state of two semiconductor chips (a microcomputer chip and an EEPROM chip) in the first embodiment.
Figure 8:
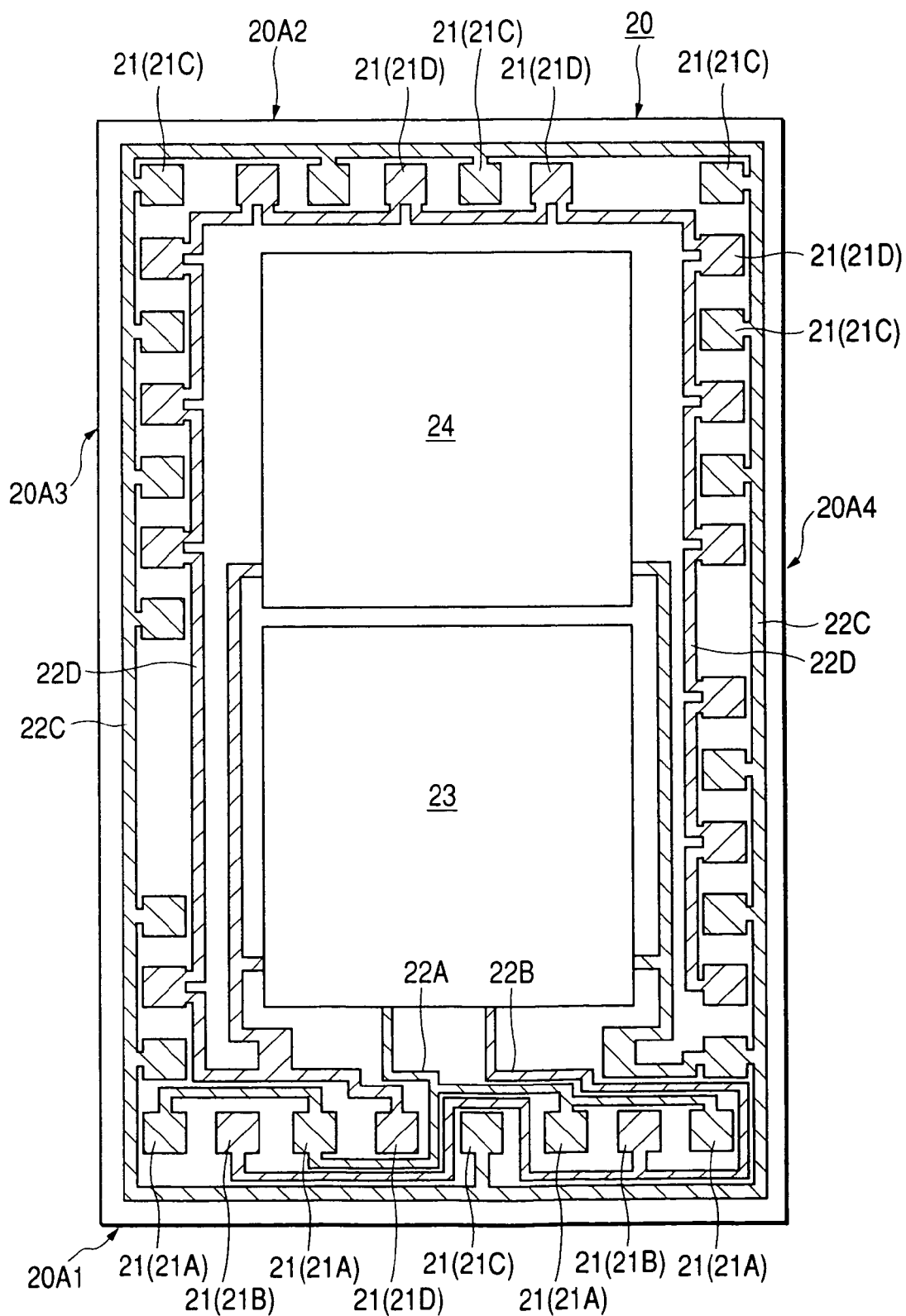
FIG. 8 is a plane layout diagram of the EEPROM chip in the first embodiment.

FIG. 1 is a schematic plan view of a semiconductor device according to the first embodiment of the present invention, with an upper portion of a resin seal member removed;

FIG. 2 is a schematic sectional view approximately taken along line a—a in FIG. 1;

FIG. 3 is a schematic sectional view approximately taken along line b—b in FIG. 1;

FIG. 4 is a schematic sectional view approximately taken along line c—c in FIG. 1;

FIG. 5 is a schematic sectional view approximately taken along line d—d in FIG. 1;

FIG. 6 is a partially enlarged, schematic sectional view of FIG. 4;

FIG. 7 is a schematic plan view showing a stacked state of two semiconductor chips (a microcomputer chip and an EEPROM chip) incorporated in the semiconductor device;

FIG. 8 is a plane layout diagram of the EEPROM chip; and

Figure 9:
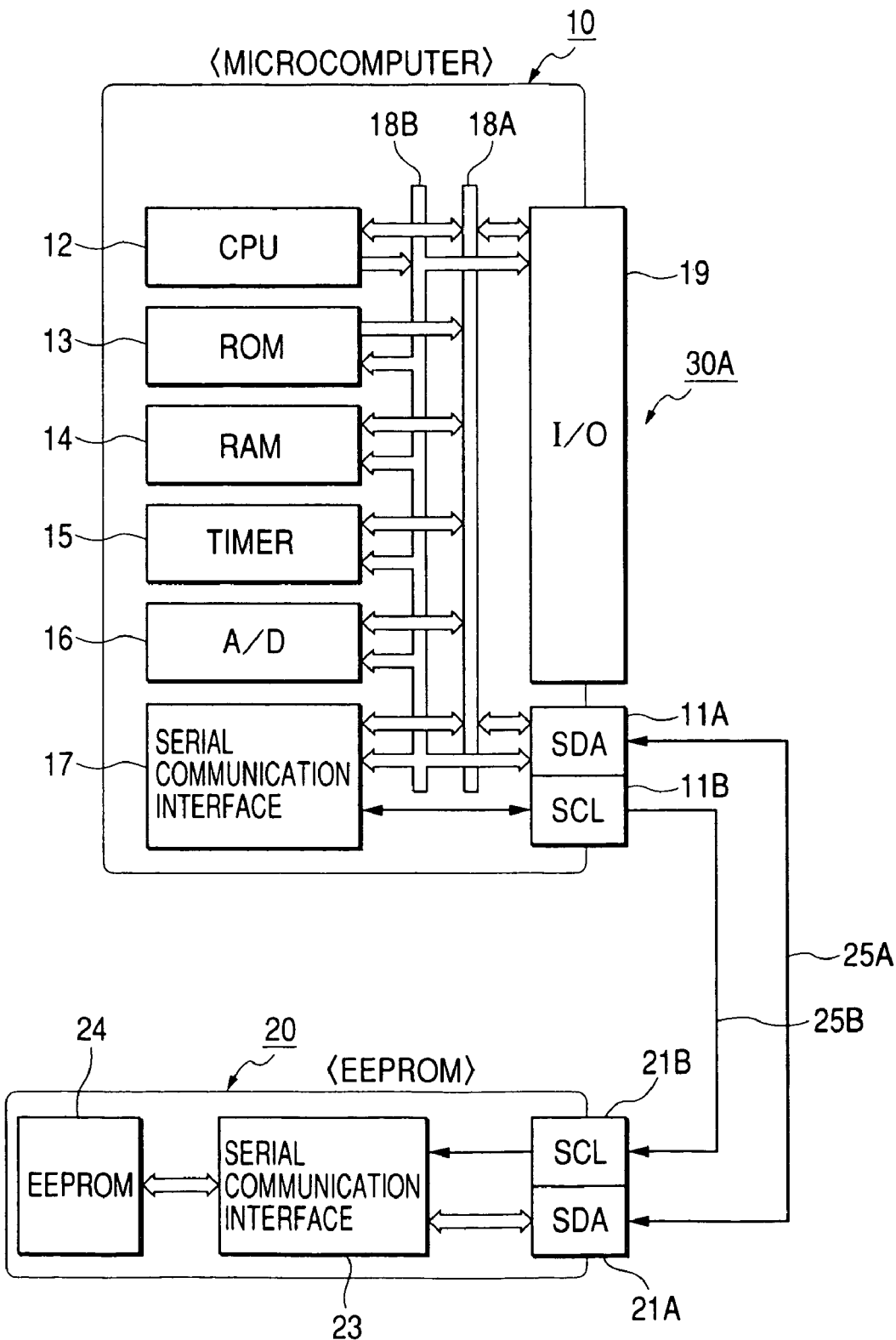
FIG. 9 is a system block diagram of the semiconductor device of the first embodiment.

FIG. 9 is a system block diagram of the semiconductor device.

FIGS. 2 to 5 are schematic sectional views in which the respective cutting plane lines are partially bent so that bonding wires and the two semiconductor chips can be seen.

According to the construction of a QFP type semiconductor device 30A of this embodiment, as shown in FIGS. 1 to 5, two semiconductor chips (a microcomputer chip 10 and an EEPROM chip 20) are stacked up and down and sealed with a single resin seal member 17.

The microcomputer chip 10 and the EEPROM chip 20 are formed in different plane sizes (external dimensions) and each in a quadrangular plane shape. In this embodiment, the microcomputer chip 10 is formed in a rectangular plane shape of 4.05 [mm]×4.15 [mm] and the EEPROM chip 20 is formed in a rectangular plane shape of 1.99 [mm]×1.23 [mm]. Thus, the plane size of the EEPROM chip 20 is smaller than that of the microcomputer chip 10. The plane size means the size of a circuit-formed surface to be described later. The EEPROM chip 20 is smaller in the area of the circuit-formed surface than the microcomputer chip 10.

The microcomputer chip 10 and the EEPROM chip 20 are each provided with a semiconductor substrate formed by say a single crystal silicon, a multi-layer interconnection comprising plural stages of insulating layers and wiring layers which are formed on a circuit-formed surface of the semiconductor substrate, and a surface protecting film (a final protecting film) formed so as to cover the multilayer interconnection.

The microcomputer chip 10 has a circuit-formed surface (one main surface) 10A and a back side (another main surface) opposite to each other, with plural bonding pads 11 being formed on the circuit-formed surface 10A. The plural bonding pads 11 are formed on the top wiring layer in the multi-layer interconnection on the microcomputer chip 10. The top wiring layer is coated with the overlying surface protecting film and a bonding opening is formed in the surface protecting film for allowing surfaces of the bonding pads to be exposed.

Likewise, the EEPROM chip 20 has a circuit-formed surface (one main surface) 20A and a back side (another main surface) opposite to each other, with plural bonding pads 11 being formed on the circuit-formed surface 20A. The plural bonding pads 21 are formed on the top wiring layer in the multi-layer interconnection on the EEPROM chip 20. The top wiring layer is coated with the overlying surface protecting film and a bonding opening is formed in the surface protecting film for allowing the bonding pads 21 to be exposed.

The bonding pads 11 on the microcomputer chip 10 and the bonding pads 21 on the EEPROM chip 20 are formed each in a square plane shape of say 65 [µm]×65 [µm].

As shown in FIGS. 1 and 7, the plural bonding pads 11 on the microcomputer chip 10 are arranged along four sides (two long sides (10A1, 10A2) opposed to each other and two short sides (10A3, 10A4) opposed to each other) of the microcomputer chip. Likewise, the plural bonding pads 21 on the EEPROM chip 20 are arranged along four sides (two short sides (20A1, 20A2) opposed to each other and two long sides (20A3, 20A4) opposed to each other) of the EEPROM chip.

As shown in FIGS. 1 to 5, the EEPROM chip 20 is disposed on and is bonded and fixed to the circuit-formed surface 10A of the microcomputer chip 10 through an adhesive layer 15 in a state such that the back side as another main surface of the EEPROM chip 20 is opposed to the circuit-formed surface 10A of the microcomputer chip 10. In this embodiment, a polyimide-based bonding resin film is used as the adhesive layer.

The microcomputer 10 is bonded and fixed to a die pad 5 through an adhesive layer in a state such that the back side thereof is opposed to the die pad 5. Four suspension leads 6 are integral with the die pad 5 and a support member 4 is constituted by the die pad 5 and the four suspension leads 6.

The resin seal member 17 is formed in a quadrangular plane shape. In this embodiment, the resin seal member 17 is formed in a square plane shape of 10 [mm]×10 [mm]. For the purpose of diminishing stress, the resin seal member 17 is formed, for example, by an epoxy resin containing a phenol curing agent, a silicone rubber and a filler. For forming the resin seal member 17 there is adopted a transfer molding method which is suitable for mass production. According to the transfer molding method, a molding die provided with a pot, a runner, an inlet gate, and a cavity, is used and resin is poured into the cavity from the pot through the runner and the inlet gate to form the resin seal member.

Plural leads 2 are arranged around the microcomputer chip 10 along the four sides of the resin seal member 17. Each of the plural leads 2 has an inner lead portion and an outer lead portion integral with the inner lead portion. The inner lead portion of each lead 2 is positioned in the interior of the resin seal member 17, while the outer lead portion is positioned in the exterior of the resin seal member. Thus, the plural leads 2 extend over both interior and exterior of the resin seal member 17. The outer lead portion of each lead 2 is bent, for example, in a gull wing shape which is one of surface-mounted type lead shapes.

As shown in FIG. 9, the microcomputer chip 10 comprises a processor unit (CPU) 12, a ROM unit 13, a RAM unit 14, a timer unit 15, an A/D converter unit 16, a serial communication interface unit 17, and a data input/output circuit unit (I/O), which are mounted on one and same substrate. These units are interconnected through a data bus 18A and an address bus 18B. The processor unit 13 is mainly composed of a central processing section, a control circuit section, and an arithmetic circuit section. The microcomputer chip 10 thus constructed operates in accordance with a program.

The EEPROM chip 20 comprises a serial communication interface unit 23 and a non-volatile memory unit 24 both mounted on one and same substrate.

The EEPROM chip 20 has a bonding pad 21A for serial data (SDA) and a bonding pad 21B for serial clock (SCL), which are signal terminals, among the plural bonding pads 21. Likewise, the microcomputer chip 10 has a bonding pad 11A for serial data (SDA) and a bonding pad 11B for serial clock (SCL), which are signal terminals, among the plural bonding pads 11. The bonding pad 21A on the EEPROM chip 20 is electrically connected to the bonding pad 11A for SDA on the microcomputer chip 10 through a signal transfer path 25A, and the bonding pad 21B for SCL on the EEPROM chip 20 is electrically connected to the bonding pad 11B for SCL on the microcomputer chip 20 through a signal transfer path 25B. In accordance with operation of the microcomputer chip 10, serial data are written into the non-volatile memory unit 24 in the EEPROM chip 20. More specifically, write and read operations of the non-volatile memory unit (memory circuit) 24 in the EEPROM chip 20 are controlled in accordance with control signals provided from the processor unit (control circuit) 12 in the microcomputer chip 10. The signal transfer paths 25A and 25B are composed of inner lead portions of leads and two bonding wires.

As shown in FIG. 8, the plural bonding pads 21 on the EEPROM chip 20 include the bonding pad 21A for SDA, the bonding pad 21B for SCL, a bonding pad 21C for VCC as a power supply terminal to which a first potential (say 5[V]) is applied, and a bonding pad 21D for VSS as a power supply terminal to which a second potential (say 0[V]) is applied. The bonding pad 21A for SDA, the bonding pad 21B for SCL, the bonding pad 21C for VCC, and the bonding pad 21D for VSS are provided each in a plural number.

Plural bonding pads 21A for SDA and bonding pads 21B for SCL are arranged along a side 20A1 of the EEPROM chip 20. Plural bonding pads 21C for VCC and bonding pads 21D for VSS are arranged mainly along sides 20A2, 20A3 and 20A4 of the EEPROM chip 20.

Plural bonding pads 21A for SDA and 21B for SCL are divided into two groups, and in these two pad groups each bonding pad 21B for SCL is disposed between two bonding pads 21A for SDA. Bonding pads 21C for VCC and 21D for VSS are disposed between the two pad groups.

Plural bonding pads 21C for VCC and 21D for VSS are mainly arranged in an alternate manner.

Plural bonding pads 21A for SDA are electrically interconnected through an internal wiring line 22A on the EEPROM chip 20, plural bonding pads 21B for SCL are electrically interconnected through an internal wiring line 22B on the EEPROM chip 20, plural bonding pads 21C for VCC are electrically interconnected through an internal wiring line 22C on the EEPROM chip 20, and plural bonding pads 21D for VSS are electrically interconnected through an internal wiring line 22D on the EEPROM chip 20.

As shown in FIGS. 1 to 5, plural bonding pads 11 on the microcomputer chip 10 are electrically connected respectively to inner lead portions of plural leads 2 through bonding wires 16.

In the EEPROM chip 20, one of the plural bonding pads 21 for VSS is electrically connected through a bonding wire 16 to an innner lead portion of a lead 2D which is electrically connected to a bonding pad 11D for VSS out of plural bonding pads 11 on the microcomputer chip 10 (see FIG. 2). One of the plural bonding pads 21C for VCC is electrically connected through a bonding wire 16 to an inner lead portion of a lead 2C which is electrically connected to a bonding pad 11C for VCC out of plural bonding pads 11 on the microcomputer chip 10 (see FIG. 3). One of plural bonding pads 21A for SAD is electrically connected through a bonding wire 16 to an inner lead portion of a lead 2A which is electrically connected to a bonding pad 11A for SAD out of plural bonding pads 11 on the microcomputer chip 10 (see FIG. 4). Further, one of plural bonding pads 21B for SCL is electrically connected through a bonding wire 16 to an inner lead portion of a lead 2B which is electrically connected to a bonding pad 11B for SCL out of plural bonding pads 11 on the microcomputer chip 10 (see FIG. 5).

Thus, an electrical connection between the microcomputer chip 10 and the EEPROM chip 20 is made by an inner lead portion of a lead 2 and two bonding wires 16. Such a configuration permits the use of a lead frame as it is which has been developed in conformity with the microcomputer chip 10. Therefore, it is not necessary to newly develop a lead frame for each type of a microcomputer chip 10, nor is it necessary to develop each type of a microcomputer chip having bonding pads for EEPROM which are for electrical connection with the EEPROM chip 20.

A serial data signal is outputted from the bonding pad 11A for SDA on the microcomputer chip 10 and is inputted to the bonding pad 21A for SDA on the EEPROM chip 20 through bonding wire 16, lead 2, and bonding wire 16. A serial clock signal is outputted from the bonding pad 11B for SCL on the microcomputer chip 10 and is inputted to the bonding pad 21B for SCL on the EEPROM chip 20 through bonding wire 16, lead 2, and bonding wire 16.

A bonding wire for connection between a bonding pad 11 on the microcomputer chip 10 and a lead 2 is connected on one end side to the bonding pad 11 on the microcomputer chip 10 and on the opposite end side to the inner lead portion of the lead 2. A bonding wire 16 for connection between a bonding pad 21 on the EEPROM chip 20 and a lead 2 is connected one end side to the bonding pad 21 on the EEPROM chip 20 and on the opposite end side to the inner lead portion of the lead 2. The opposite end sides of these bonding wires 16 are connected to the same sides of the leads 2.

As shown in FIG. 7, the EEPROM chip 20 is disposed on the circuit-formed surface 20A of the EEPROM chip 20 in such a manner that the position of a central point (central coordinate point) P2 of the EEPROM chip 20 is deviated from a central point (central coordinate point) P1 of the microcomputer chip 10. This is for the purpose of shortening the length of bonding wire 16. The central point of the microcomputer chip 10 indicates a point at which an X—X center line 10X extending in the same direction as the side 10A1 of the microcomputer chip 10 and a Y—Y center line 10Y orthogonal to the X—X center line 10X cross each other. The central point P2 of the EEPROM chip 20 indicates a point at which an X—X center line 20X extending in the same direction as the side 20A1 of the EEPROM chip 20 and a Y—Y center line 20Y orthogonal to the X—X center line 20X cross each other. The central point P1 of the microcomputer chip 10 is also an intersecting point of diagonal lines on the square microcomputer chip 10. Likewise, the central point P2 of the EEPROM chip 20 is also an intersecting point of diagonal lines on the square EEPROM chip 20.

In this embodiment, the bonding pad 11C for VCC and bonding pad 11D for VSS on the microcomputer chip 10 are disposed on the side 10A3 of the microcomputer chip 10, while the bonding pad 11A for SDA and bonding pad 11B for SCL on the microcomputer chip 10 are dispose don the side 10A1 of the microcomputer chip 10, so the central point P2 of the EEPROM chip 20 is positioned on the 10A3 and 10A1 sides of the microcomputer chip 10 with respect to the central point P1 of the microcomputer chip 10. In this embodiment, the central point P2 of the EEPROM chip 20 is deviated, for example, about 100 to 150 [μm] to each of the sides 10A3 and 10A1 of the microcomputer chip 10 with respect to the central point P1 of the microcomputer chip 10, whereby it is possible to shorten the length of the bonding wires which connect the bonding pads 21C, 21D, 21A, and 21B for VCC, VSS, SDA, and SCL, respectively, on the EEPROM chip 20 with leads.

In setting the deviation of the EEPROM chip 20 with respect to the microcomputer chip 10, it is necessary to take into account the flowing of resin which is poured into the cavity at the time of forming a resin seal member in accordance with the transfer molding method.

As shown in FIG. 6, the thickness T2 of the EEPROM chip 20 is smaller than the thickness T1 of the microcomputer chip 10. The distance L from the circuit-formed surface 10A of the microcomputer chip 10 to the circuit-formed surface 20A of the EEPROM chip 20 is smaller than the thickness T1 of the microcomputer chip 10. In this embodiment, the thickness T1 of the microcomputer 10 is set at say 280 [μm], the thickness T2 of the EEPROM chip 20 is set at say 200~250 [μm], and the thickness of the adhesive layer 15 is set at say 25 [μm].

Figure 10:
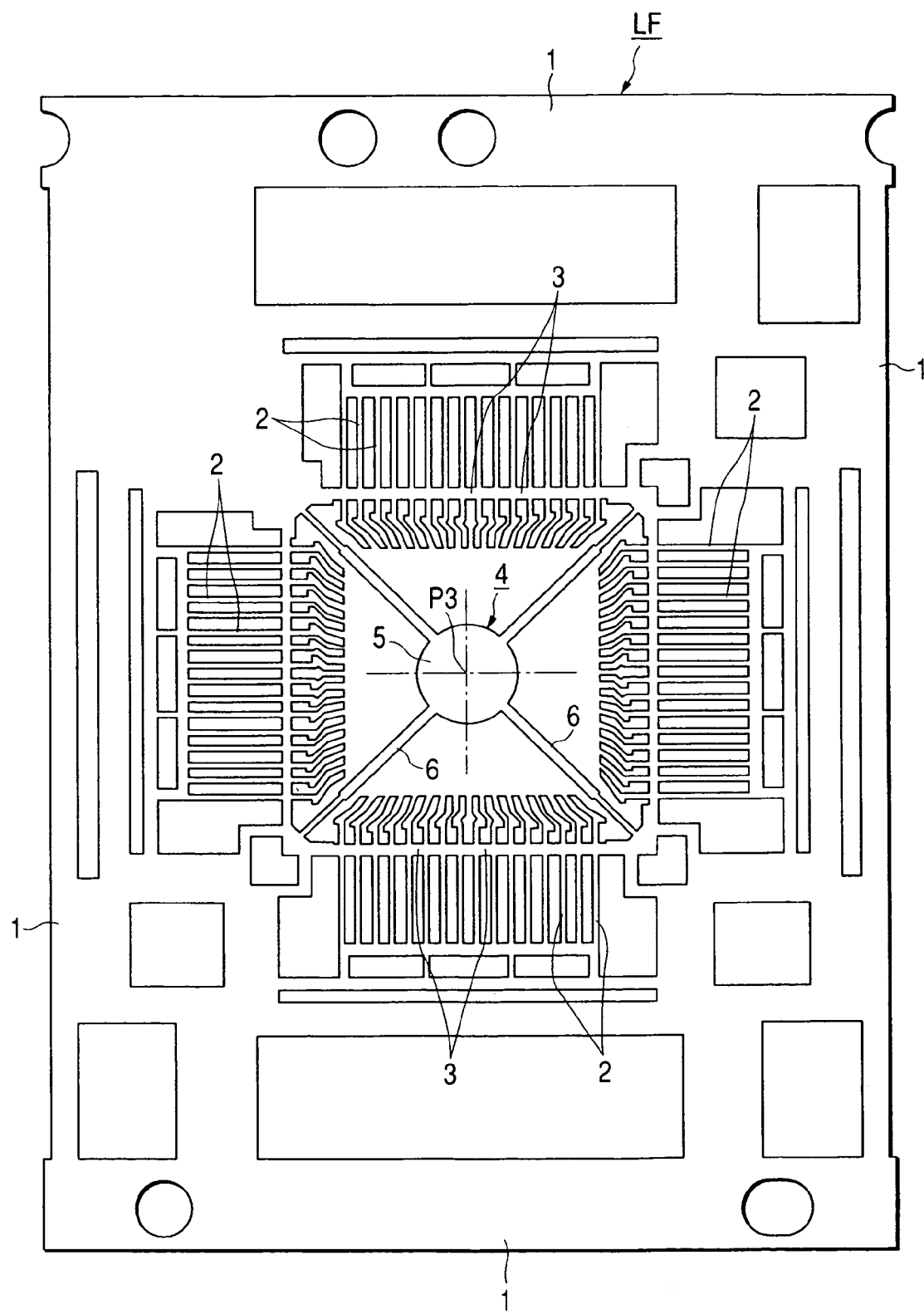
FIG. 10 is a schematic plan view of a lead frame used in the manufacture of the semiconductor device of the first embodiment.

Now, with reference to FIG. 10, the following description is provided about the lead frame used in the manufacture of the semiconductor device 30A. FIG. 10 is a schematic plan view of the lead frame. Actually, the lead frame is of a multi-frame structure so as to permit the manufacture of plural semiconductor devices. To let the drawing easier to see, FIG. 10 illustrates an area of one semiconductor device to be manufactured.

As shown in FIG. 10, a lead frame LF comprises plural leads 2 and a support member 4 in a lead arrangement area defined by a frame body (frame) 1. The support member 4 has a die pad 5 and four suspension leads 6 formed integrally with the die pad 5. The die pad 5 is formed so that a central point P3 thereof is positioned at a central point of the lead arrangement area. The central point of the lead arrangement area indicates a point at which an X—X center line in X direction in the lead arrangement area and a Y—Y center line orthogonal to the X—X center line intersect each other. The central point P3 of the die pad 5 indicates a point at which an X—X center line in X direction of the die pad and a Y—Y center line orthogonal to the X—X center line intersect each other. The central point P3 coincides with an intersecting point of extension lines of two adjacent suspension leads 6. The central point P3 also coincides with an intersecting point of extension lines of the four suspension leads 6.

The plural leads are divided into four lead groups, which are arranged around the die pad 5 so that two lead groups are opposed to each other. The leads 2 in two lead groups opposed to each other out of the four lead groups are arranged in the same direction as the X—X center line in the lead arrangement area. The leads 2 in the other two lead groups also opposed to each other are arranged in the same direction as the Y—Y center line in the lead arrangement area. The leads 2 in each lead group have inner lead portions and outer lead portions, which are integral and connected with each other through tiebars 3.

The lead frame LF is formed by etching or pressing a flat plate to form a predetermined lead pattern thereon, the flat plate being formed of, for example, an iron (Fe)—nickel (Ni)-base alloy or copper (Cu) or a copper alloy.

Figure 11:
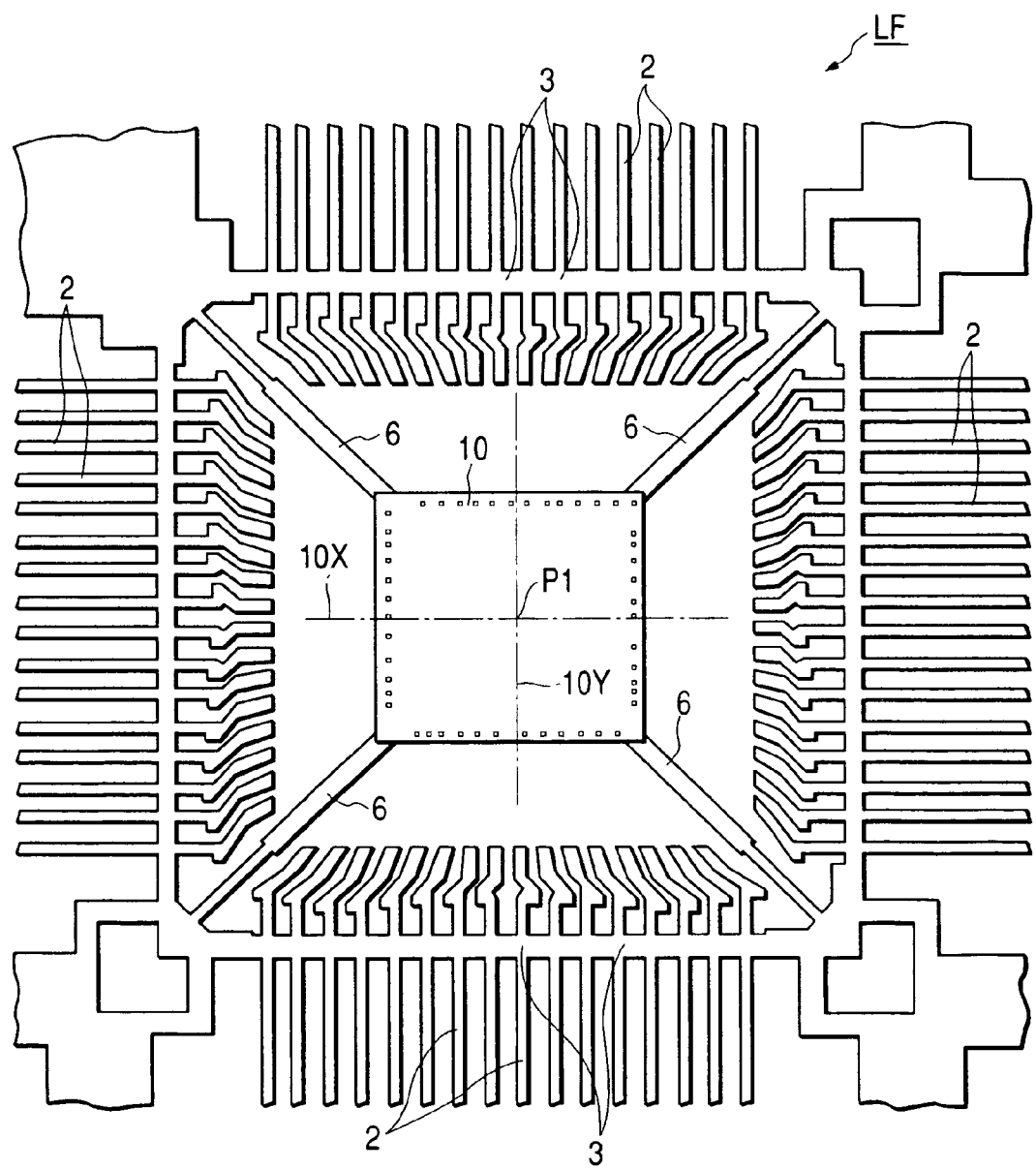
FIG. 11 is a schematic plan view for explaining a chip bonding process in the manufacture of the semiconductor device of the first embodiment.
Figure 12:
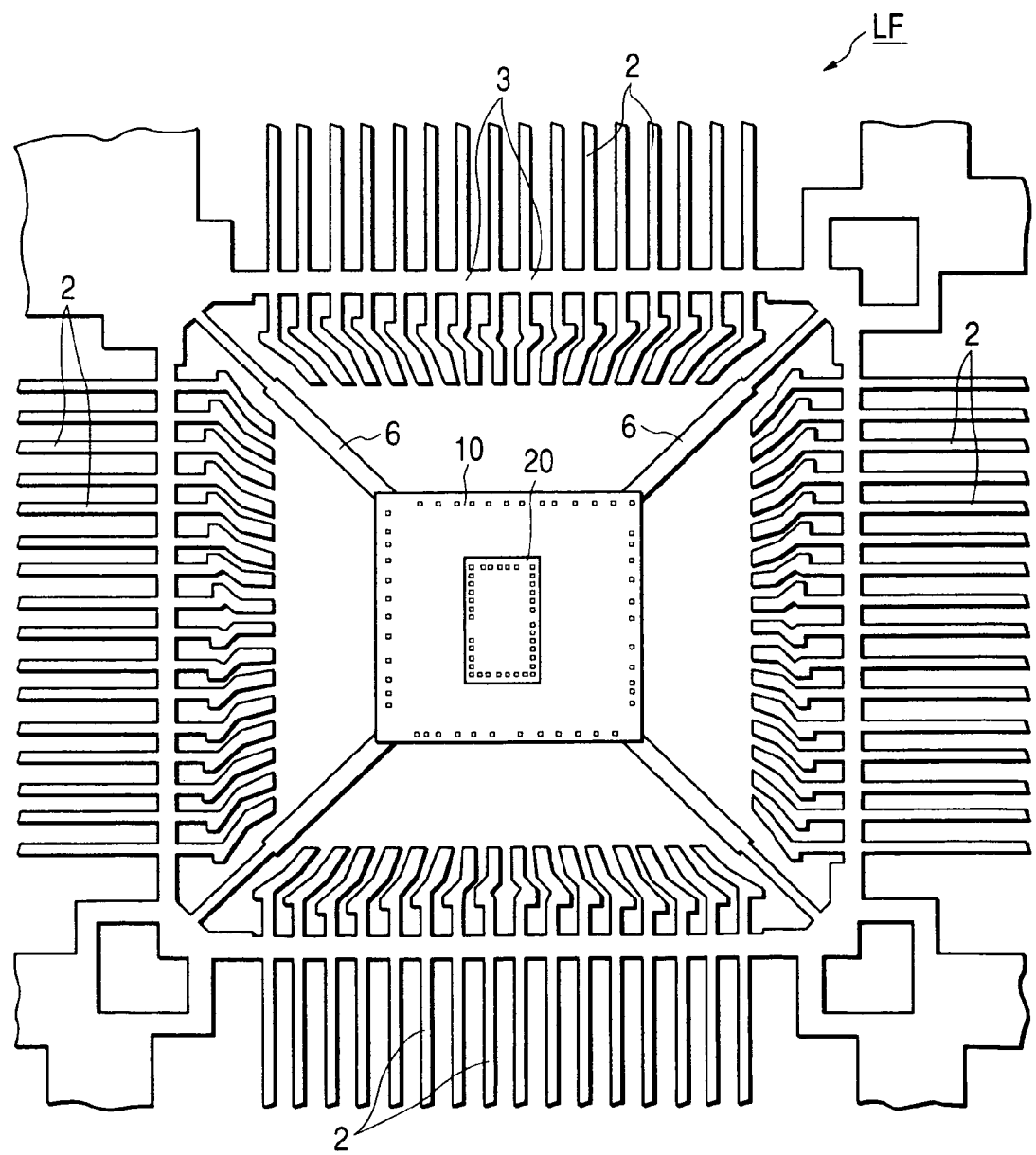
FIG. 12 is a schematic plan view for explaining the chip bonding process.
Figure 14:
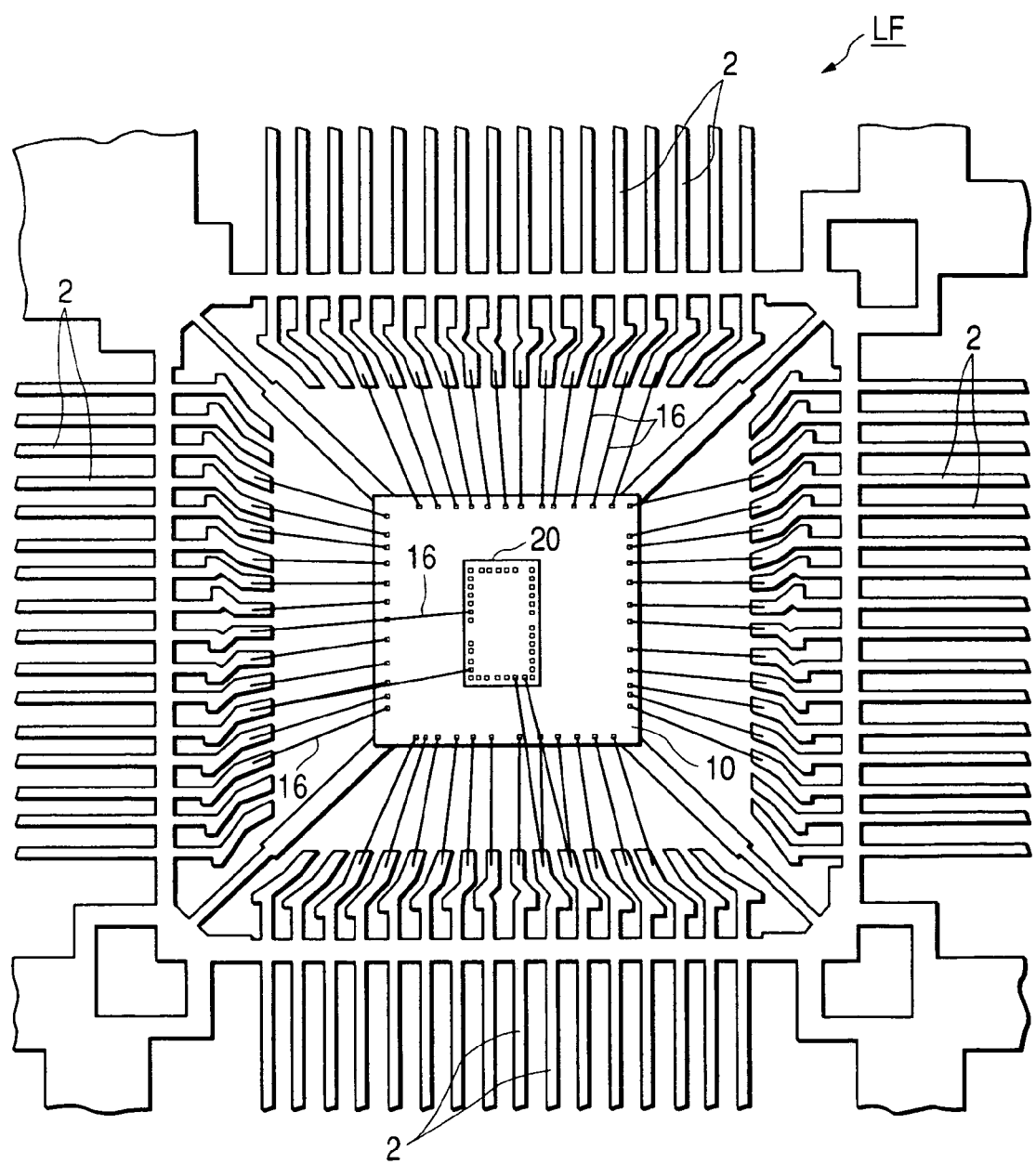
FIG. 14 is a schematic plan view for explaining a wire bonding process in the manufacture of the semiconductor device of the first embodiment.
Figure 15:
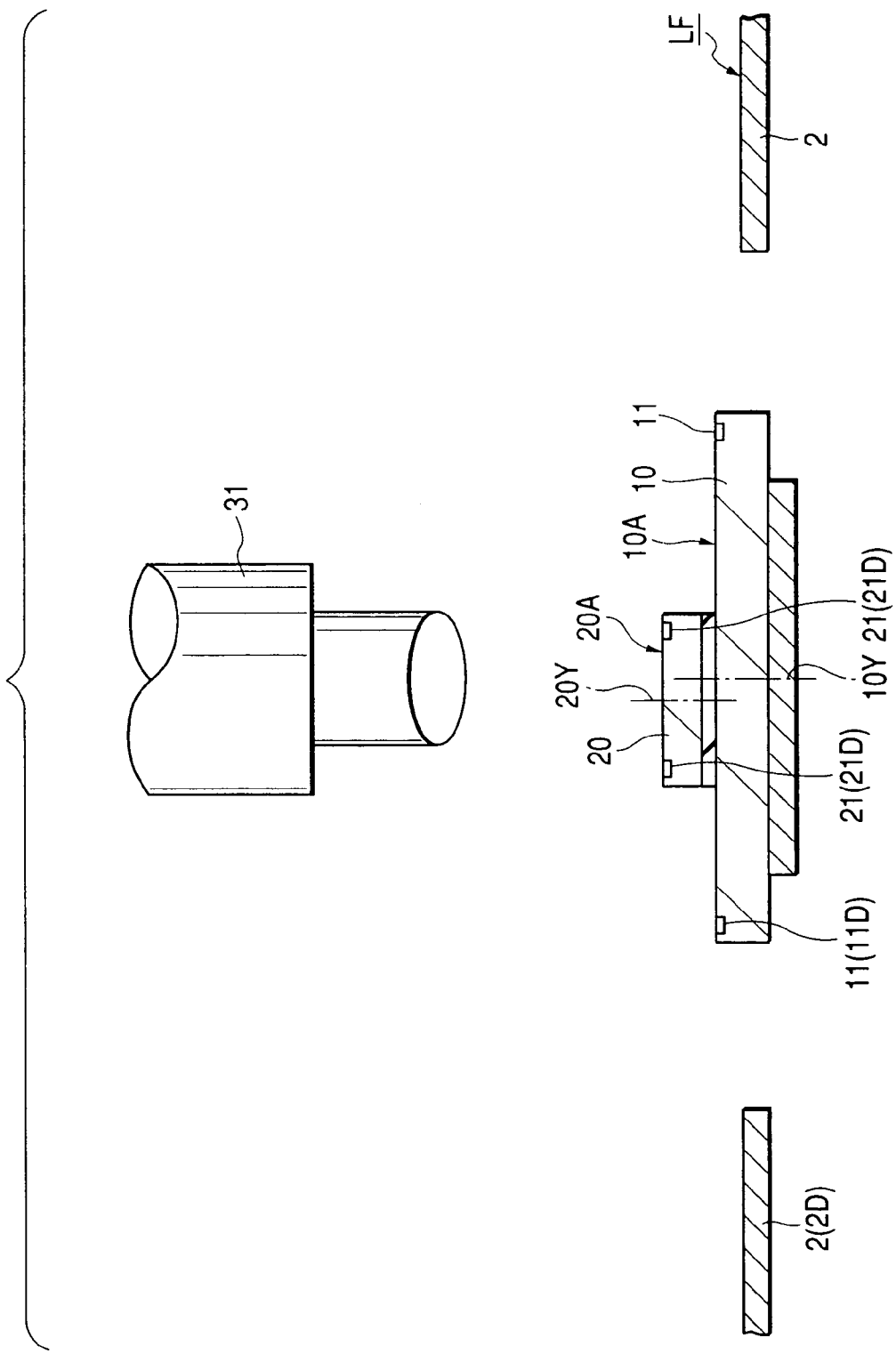
FIG. 15 is a schematic sectional view for explaining the wire bonding process.
Figure 16:
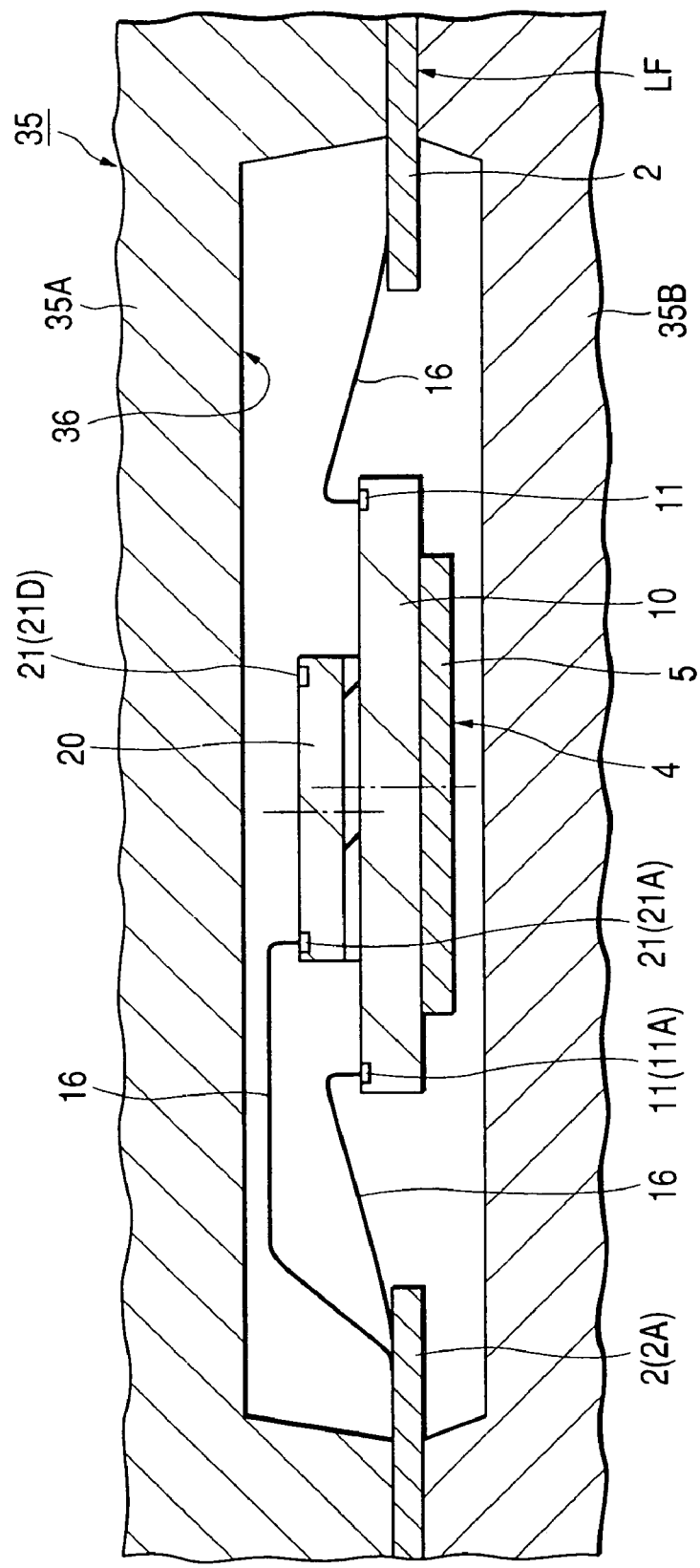
FIG. 16 is a schematic sectional view for explaining a resin seal member forming process in the manufacture of the semiconductor device of the first embodiment.
Figure 17:
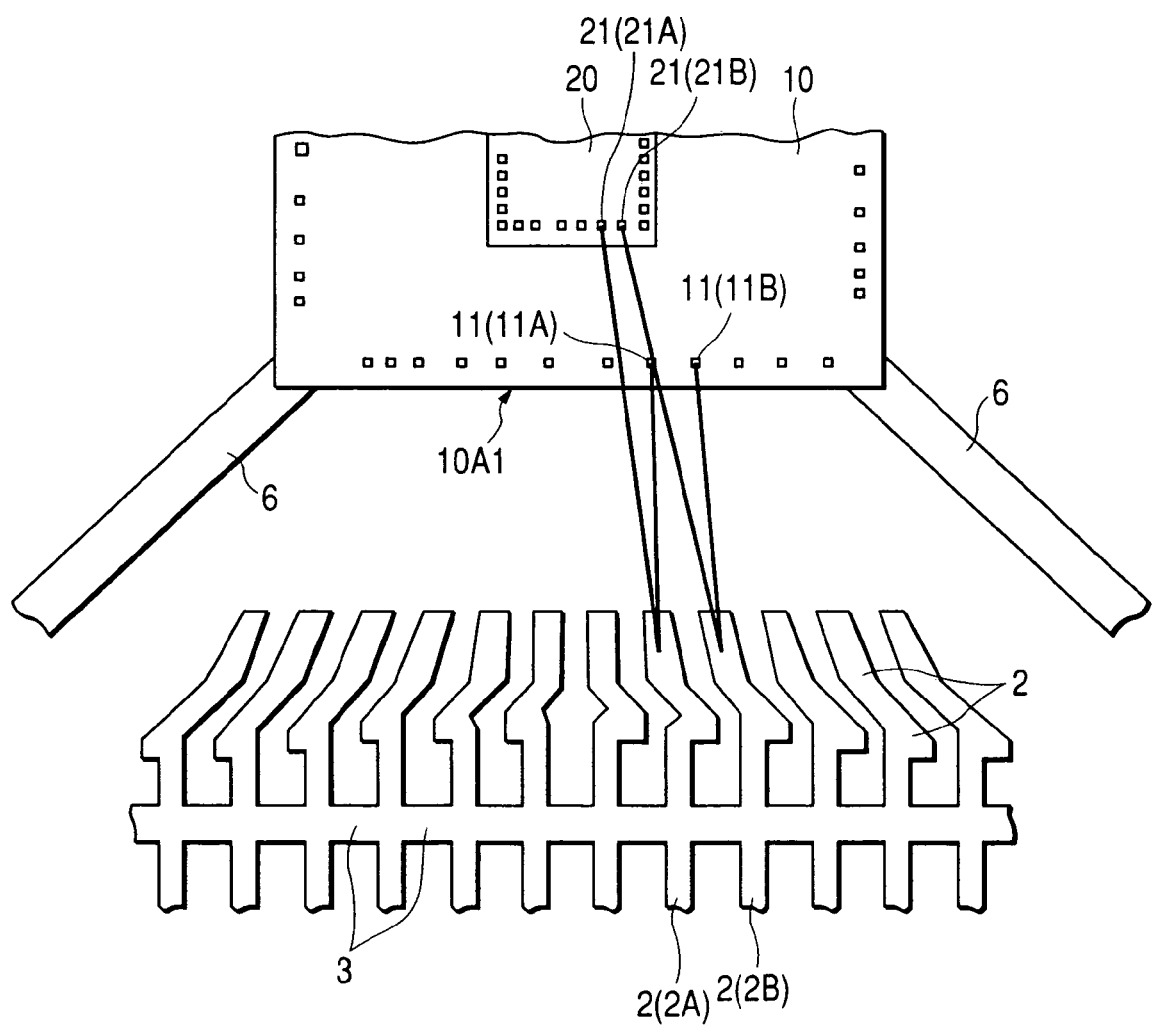
FIG. 17 is a partially enlarged schematic sectional view of FIG. 14.

Next, a description will be given below about the manufacture of the semiconductor device 30A with reference to FIGS. 11 to 18, of which:

FIGS. 11 and 12 are schematic plan views for explaining a chip bonding process;

FIG. 13 is a schematic sectional view for explaining the chip bonding process, in which (A) is a schematic sectional view at a position corresponding to line a—a in FIG. 1 and (B) is a schematic sectional view at a position corresponding to line c—c in FIG. 1;

FIGS. 14 and 15 are schematic plan views for explaining a wire bonding process;

FIG. 16 is a schematic sectional view for explaining a resin seal member forming process;

FIG. 17 is a partially enlarged, schematic sectional view of FIG. 14; and

Figure 18:
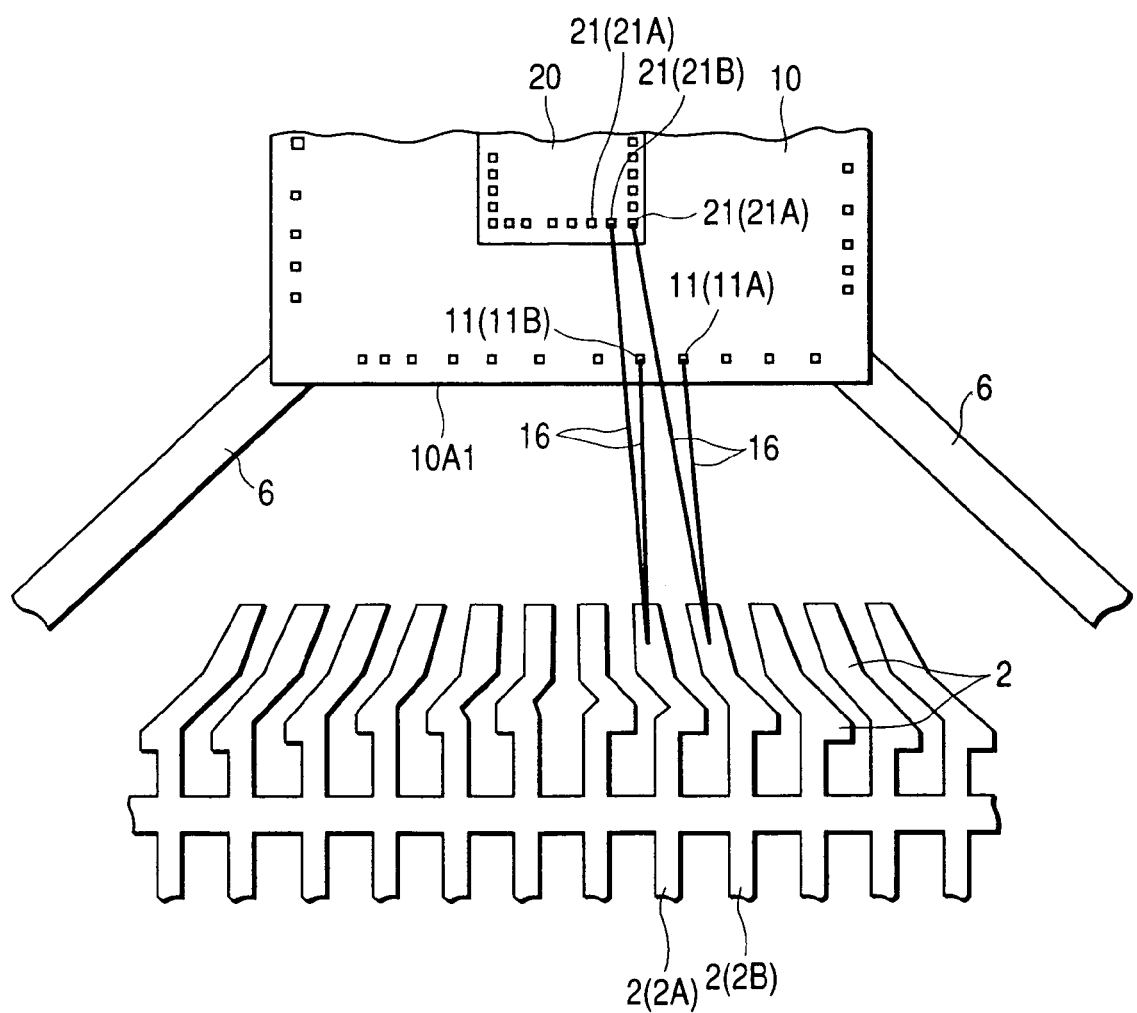
FIG. 18 is a schematic sectional view showing a wire connected state using another microcomputer chip.
Figure 19:
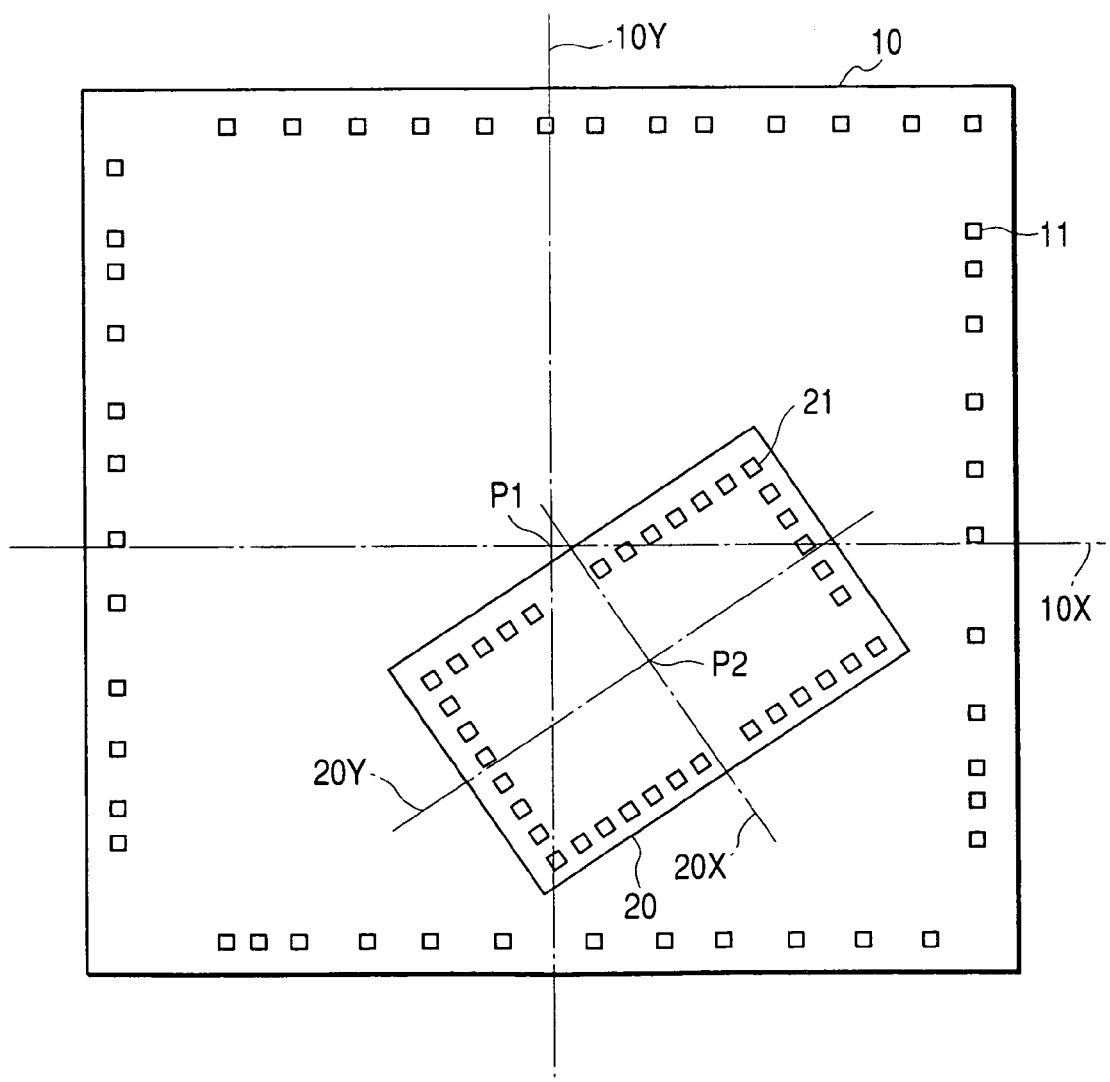
FIG. 19 is a schematic plan view showing a stacked state of two semiconductor chips (a microcomputer chip and an EEPROM chip) according to a modification of the first embodiment.

FIG. 18 is a schematic sectional view showing a wire connected state using another microcomputer chip.

First, as shown in FIG. 10, the lead frame LF is conveyed to a die bonding apparatus. Thereafter, as shown in FIG. 1, the microcomputer chip 10 is bonded and fixed to the lead frame LF. The bonding and fixing of the microcomputer chip 10 to the lead frame LF is performed by first applying an adhesive, which is say a thermosetting resin, onto a chip mounting surface of the die pad 5 and thereafter thermocompression-bonding the microcomputer chip 10 onto the chip mounting surface of the die pad. At this time, positioning is performed so that the central point P1 of the microcomputer chip 1 is positioned at the central point P3 of the die pad 5.

Next, as shown in FIG. 12, the EEPROM chip 20 is bonded and fixed to the microcomputer chip 10. Bonding and fixing of both chips is performed by thermocompression-bonding the EEPROM chip 20 to the microcomputer chip 10 while interposing an adhesive layer 15 between the circuit-formed surface 10A of the microcomputer chip and the back side of the EEPROM chip 20, the adhesive layer 15 being formed by a thermosetting adhesive resin film for example. The adhesive layer 15 is affixed beforehand to the back side of the EEPROM chip.

In this process, the EEPROM chip 20 is disposed on the circuit-formed surface 10A of the microcomputer chip 10 in a deviated state of the central point P2 of the EEPROM chip from the central point P1 of the microcomputer chip 20 in order that the bonding wires 16 which connect the bonding pads 21 on the EEPROM chip 20 with internal lead portions of the leads 2 may become shorter.

In this embodiment, as shown in FIG. 7, the bonding pads 21C for VCC and 21D for VSS on the EEPROM chip 20 are arranged on the side 10A3 of the microcomputer chip 10, while the bonding pads 21A for SDA and 21B for SCL on the EEPROM chip 20 are arranged on the side 10A1 of the microcomputer chip 10. Therefore, as shown in FIGS. 13(A) and 13(B), the EEPROM chip 20 is disposed so that its central point P2 is positioned on the 10A3 and 10A1 sides of the microcomputer chip 10 with respect to the central point P1 of the microcomputer chip 10. In this embodiment, the EEPROM chip 20 is disposed in a state such that the central point P2 thereof is deviated, for example, 100 to 150 [μm] to the 10A3 and 10A1 sides of the microcomputer chip 10 with respect to the central point P1 of the microcomputer chip. An error in positioning accuracy of the die bonding apparatus is 50 [μm] or so at most.

Next, the lead frame LF is conveyed from the die bonding apparatus to a wire bonding apparatus and, as shown in FIG. 14, the bonding pads on the microcomputer chip 10 and the inner lead portions of the leads 2 are electrically connected with each other through bonding wires 16, and thereafter the bonding pads 21 on the EEPROM chip 20 and the inner lead portions of the leads 2 are electrically connected with each other through bonding wires 16. As the bonding wires 16 there are used gold (Au) wires for example. For the connection of bonding wires 16 there is used, for example, a ball bonding method which uses ultrasonic oscillation in combination with thermo-compression bonding.

In this process, as shown in FIG. 15, the position of the underlying microcomputer chip 10 and that of the overlying EEPROM chip 20 are recognized by a CCD camera 31 and then on the basis of these position data the position of the bonding pads 11 on the microcomputer chip 10 and that of the bonding pads 21 on the EEPROM chip 20 are checked, thereafter, winding bonding is performed. Since the position of the overlying EEPROM chip 20 is detected by bringing an optical lens of the CCD camera 31 into focus with the underlying microcomputer chip 10, if the overlying EEPROM chip 20 is thick, the focusing range exceeds the depth of field of the optical lens, so that the image of the chip 20 blurs. If the image of the overlying EEPROM chip 20 blurs, there occurs an error in detecting the position of the chip 20, thus causing an error also in detecting the position of bonding pads 21. Consequently, a defective connection between the bonding pads 21 on the EEPROM chip 20 and the bonding wires 16 is apt to occur. Since in this embodiment the EEPROM thinner than the underlying microcomputer chip 10 is used as the overlying chip, it is possible to suppress the occurrence of an error in detecting the position of the EEPROM chip 20 which error is caused by the blur of image. Further, since the adhesive layer 15 is interposed between the microcomputer chip 10 and the EEPROM chip 20, it is desirable that the distance from the circuit-formed surface 10A of the microcomputer chip 10 to the circuit-formed surface 20A of the EEPROM chip 20 be set smaller than the thickness of the chip 10. In this embodiment the adhesive layer 15 is formed by using a bonding resin film. The use of the bonding resin film permits the adhesive layer 15 to be formed thinner than in forming the adhesive layer 15 by applying an adhesive to the circuit-formed surface of the microcomputer chip 20. That is, by using a bonding resin film as the adhesive layer 15 interposed between the microcomputer chip 10 and the EEPROM chip 20, the distance from the circuit-formed surface 10A of the microcomputer chip 10 to the circuit-formed surface 20A of the EEPROM chip 20 can be shortened in comparison with the case where the adhesive layer is formed by the application of an adhesive.

In this process, plural bonding pads 21A for SDA and 21B for SCL are formed along the side 20A1 of the EEPROM chip 20. Further, plural bonding pads 21C for VCC and 21D for VSS are formed along the four sides (20A1, 20A2, 20A3, 20A4) of the EEPROM chip 20. Therefore, it is possible to select a bonding pad 21 located at the shortest distance from the tip of an internal lead portion of the lead to be connected, thus making it possible to shorten the length of the bonding wire 16 which connects the bonding pad 21 on the EEPROM chip 20 and the inner lead portion of the lead 2 with each other.

Next, the lead frame LF is conveyed from the wire bonding apparatus to a molding apparatus, in which the lead frame is positioned between an upper die 35A and a lower die 35B of a molding die 35. At this time, the microcomputer chip 10, EEPROM chip 20, inner lead portions of the leads 2, bonding wires 16, and chip support member (die pad 5, suspension leads 4) are disposed in the interior of a cavity 36 of the molding die 35.

Next, resin is poured into the cavity from a pot in the molding die 35 through a runner and an inlet gate to form a resin seal member 17. At this time, the microcomputer chip 10, EEPROM chip 20, inner lead portions of the leads 2, bonding wires 16, and chip support member 4 are sealed by the resin seal member 17.

Next, the tiebars 3 connected to the leads 2 are cut, then the outer lead portions of the leads 2 are subjected to plating, then cut off from the frame body 1 of the lead frame LF and then formed into a gull wing shape, thereafter the suspension leads 6 are cut off from the frame body 1 of the lead frame LF, whereby the semiconductor device 30A shown in FIGS. 1 to 5 is almost completed.

In what order the bonding pads 11 on the microcomputer chip 10 are to be arranged, differs depending on the type of the microcomputer chip concerned. For example, as shown in FIG. 17, the bonding pad 11A for SDA on the microcomputer chip 10 used in this embodiment is located at the fifth position from the right-hand end of the side 10A1 of the chip 10 and the bonding pad 11B for SCL is located at the fourth position from the right-hand end of the side 10A1 of the microcomputer chip 10. On the other hand, in the case of a microcomputer chip 10 of a different type, as shown in FIG. 18, the bonding pad 11A for SDA is located at the fourth position from the right-hand end of the side 10A1 of the microcomputer chip 10 and the bonding pad 11B for SCL is located at the fifth position from the right-hand end of the side 10A1 of the microcomputer chip. In such a case, in what order terminal functions of the leads 2 are to be arranged also differs correspondingly to the order of arrangement of the bonding pads 11, resulting in that a bonding wire 16 which connects a bonding pad 21A for SAD on the EEPROM chip 20 with a lead 2A and a bonding wire 16 which connects a bonding pad 21B for SCL on the EEPROM chip 20 with a lead 2B cross each other. In the EEPROM chip 20 used in this embodiment, however, since two bonding pads 21A interconnected electrically are disposed respectively at both ends of the bonding pad 11B for SCL, it is possible to effect wire bonding without crossing of bonding wires 16, as shown in FIG. 18.

According to this embodiment, as described above, there can be obtained the following effects.

(1) An electrical connection between the microcomputer chip 10 and the EEPROM chip 20 is made using an inner lead portion of a lead 2 and two bonding wires 16 in the interior of the resin seal member 17. According to this configuration, a lead frame developed in conformity with the microcomputer chip 10 can be used as it is and hence it is not necessary to newly develop a lead frame for each type of the microcomputer 10, nor is it necessary to develop each type of a microcomputer chip provided with EEPROM bonding pads for electrical connection with the EEPROM chip 20. As a result, it is possible to reduce the cost of the semiconductor device 30A.

(2) The EEPROM chip 20 is thinner than the microcomputer chip 10. According to this configuration, in the wire bonding process it is possible to suppress the occurrence of a positional error at the time of detecting the position of the EEPROM chip 20 with the CCD camera which error is caused by the blur of image. As a result, it is possible to suppress a connection defect between the bonding pads 21 on the EEPROM chip 20 and the bonding wires 16, thus permitting the improvement in yield of the semiconductor device 30A.

(3) Plural bonding pads 21A for SDA and 21B for SCL are formed along the side 20A1 of the EEPROM chip 20. Further, plural bonding pads 21C for VCC and 21D for VSS are formed along the four sides (20A1, 20A2, 20A3, 20A4) of the EEPROM chip 4. According to this configuration, it is possible to select a bonding pad 21 located at the shortest distance from the tip of the inner lead portion of the lead 2 to be connected and hence possible to shorten the length of the bonding wire 16 which connects the bonding pad 21 on the EEPROM chip 20 with the inner lead portion of the lead 2. As a result, it is possible to suppress the flow of wires caused by the flow of resin poured into the cavity 36 and hence possible to suppress short-circuiting of wires caused by the flow of wires, thus permitting the improvement in yield of the semiconductor device 30A.

(4) A bonding pad 11B for SCL is disposed between two electrically interconnected bonding pads 21A for SAD. According to this configuration, wire bonding can be effected without crossing of bonding wires 16.

(5) Serial data are written into the non-volatile memory unit of the EEPROM chip 20 by operation of the microcomputer chip 10. According to this configuration, the number of signal transfer paths which provide electrical connections between the EEPROM chip 20 and the microcomputer chip 10 can be reduced, thus making it possible to reduce the number of leads 2.

Although in this embodiment reference has been made above to an example in which the position of the central point P2 of the EEPROM chip 20 is deviated with respect to the central point P1 of the microcomputer chip 10 for the purpose of shortening the length of each bonding wire 16, the EEPROM chip 20 may be displaced with respect to the microcomputer chip 10 so that two contiguous sides of the microcomputer chip 10 and one side of the EEPROM 20 confront each other. That is, the EEPROM chip 20 is disposed in such a manner that the side thereof is at an acute angle to the sides of the microcomputer chip 10 to shorten the length of bonding wires 16 which connect the bonding pads 21 on the EEPROM chip 20 with the internal lead portions of the leads 2.

(Second Embodiment)

Figure 20:
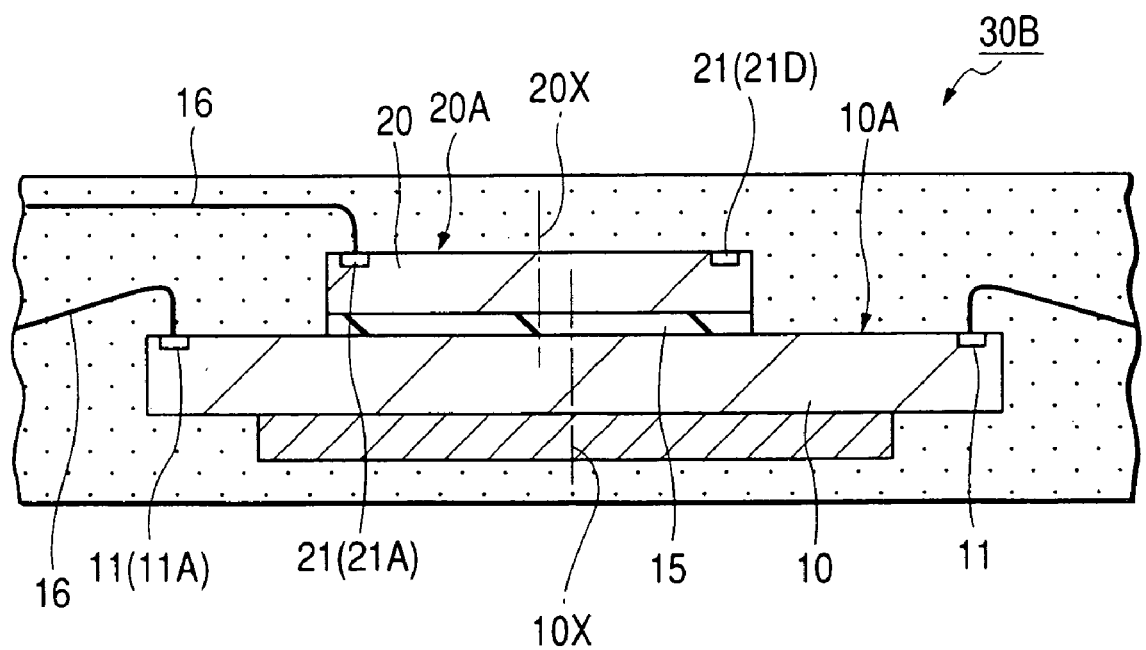
FIG. 20 is a schematic sectional view of a principal portion of a semiconductor device according to the second embodiment of the present invention.
Figure 21:
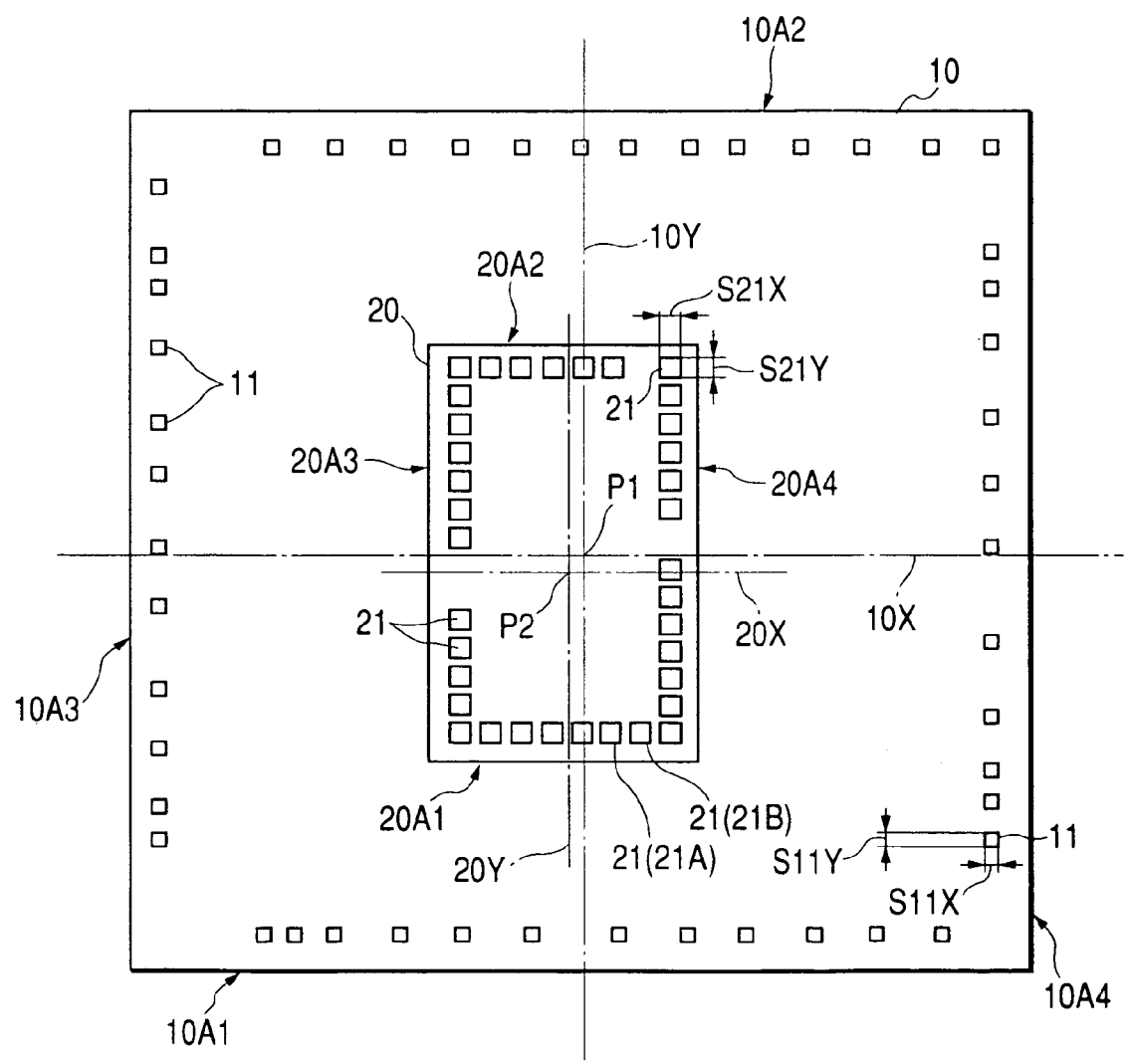
FIG. 21 is a schematic plan view showing a stacked state of two semiconductor chips (a microcomputer chip and an EEPROM chip) in the second embodiment.

FIG. 20 is a schematic sectional view of a principal portion of a semiconductor device according to the second embodiment of the present invention and FIG. 21 is a schematic plan view showing a stacked state of two semiconductor chips (a microcomputer chip and an EEPROM chip).

As shown in FIGS. 20 and 21, a semiconductor device 30B of the embodiment is of about the same configuration as that of the previous first embodiment, except the following points:

Bonding pads 21 formed on an EEPROM chip 20 are larger in plane size than bonding pads 11 formed on a microcomputer chip 10. More specifically, the size S21X of each bonding pad 21 in X direction of the EEPROM chip 20 is larger then the size S11X of each bonding pad 11 in X direction of the microcomputer chip 10, i.e., S21X>S11X. Also in Y direction there exists a relation of S21Y>S11Y. According to this configuration, in the wire bonding process it is possible to correct an error caused by the blur of image at the time of detecting the position of the EEPROM chip 20 with a CCD camera. Therefore, it is possible to suppress the occurrence of a connection defect between the bonding pads 21 on the EEPROM chip 20 and bonding wires 16. As a result, there can be attained an improvement in yield of the semiconductor device 30B.

In the case where wire bonding is performed while adjusting the CCD camera so as to be in focus with the bonding pads on the EEPROM chip 20, the relation in size between both chips becomes reverse, i.e., S21X<S11X, S21Y<S11Y. However, the previous relations are more effective because the number of bonding pads on the microcomputer chip 10 is larger than that of the EEPROM chip 20.

(Third Embodiment)

Figure 22:
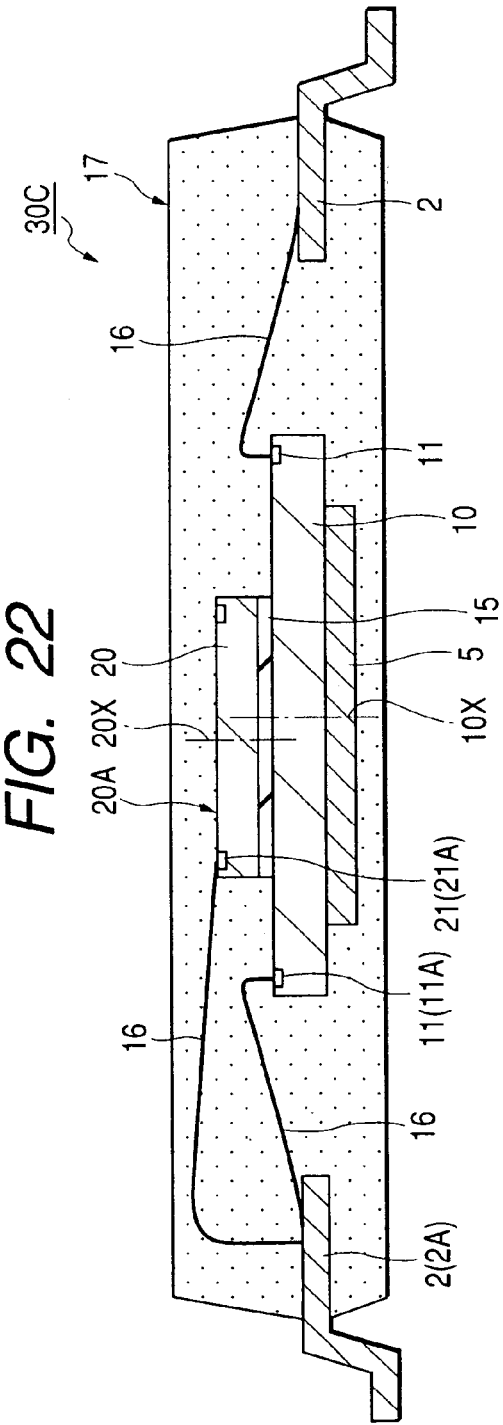
FIG. 22 is a schematic sectional view of a semiconductor device according to the third embodiment of the present invention.
Figure 23:
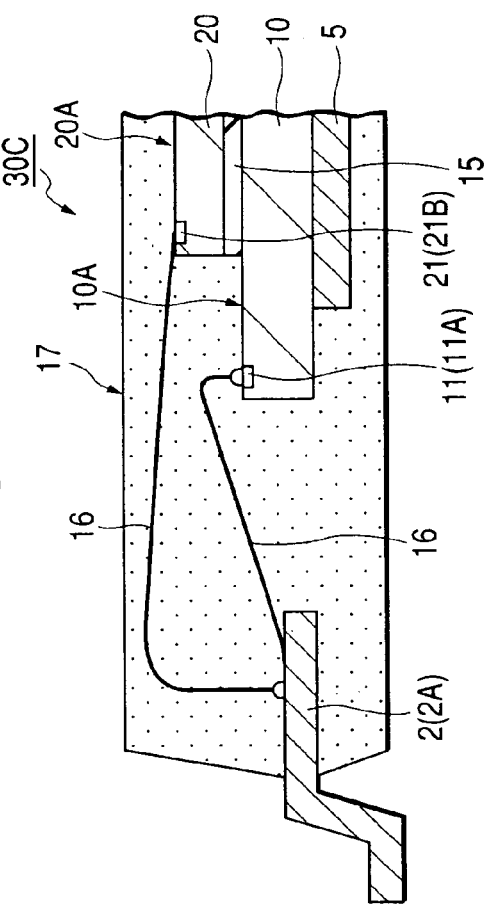
FIG. 23 is a partially enlarged, schematic sectional view of FIG. 22.
Figure 24:
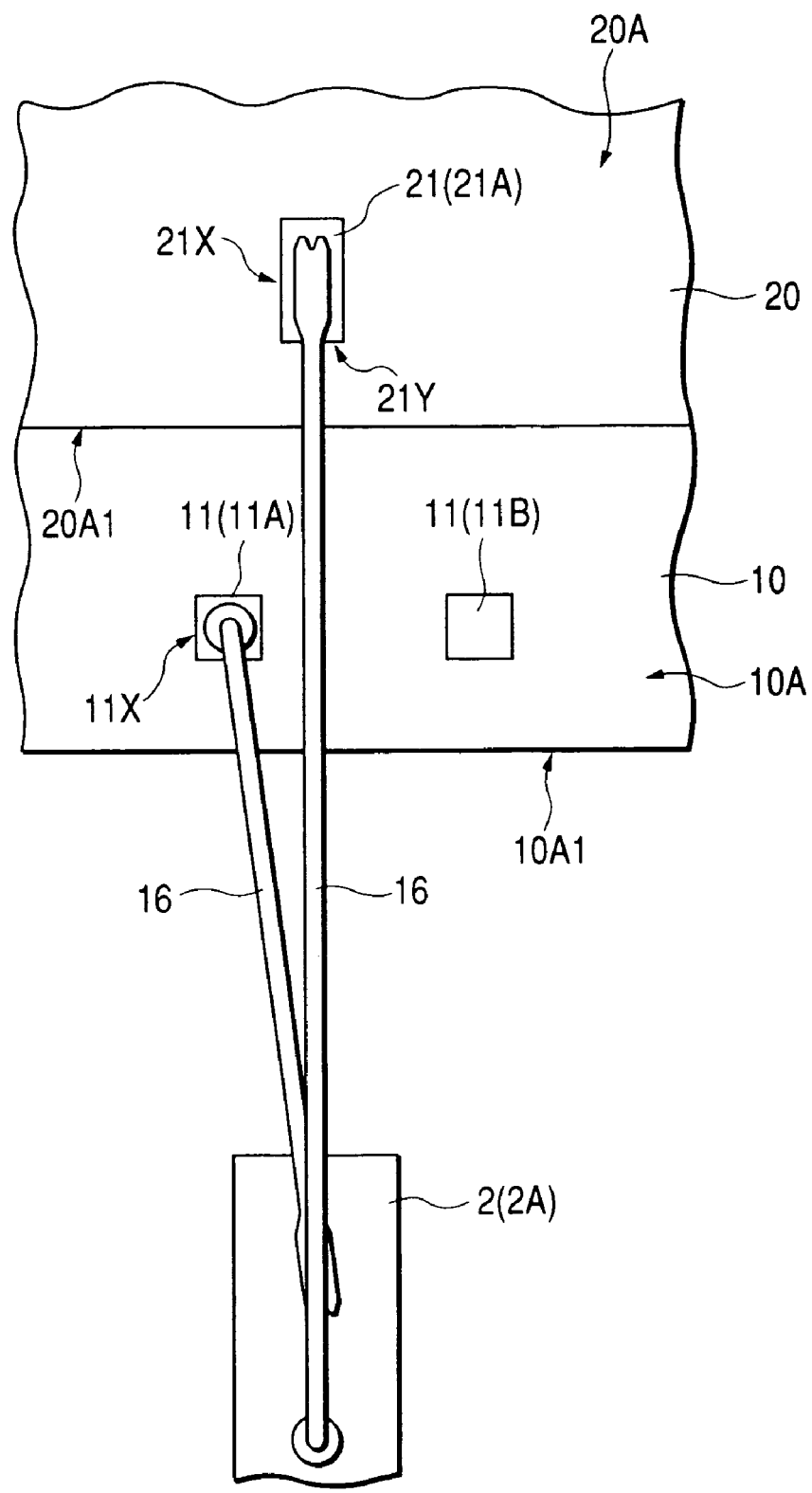
FIG. 24 is a schematic plan view of a principal portion showing a wire connected state in the third embodiment.

FIG. 22 is a schematic sectional view of a semiconductor device according to the third embodiment of the present invention, FIG. 23 is a partially enlarged, schematic sectional view of FIG. 22, and FIG. 24 is a schematic plan view of a principal portion, showing a wire connected state.

As shown in FIGS. 22 to 24, a semiconductor device 30C of this embodiment is of about the same configuration as that of the first embodiment, except the following points:

A bonding wire 16 for connection between each bonding pad 21 on an EEPROM chip 20 and an inner lead portion of each lead 2 is connected in accordance with a reverse bonding method in which the lead 2 is the first bonding side and the bonding pad 21 is the second bonding side. Each bonding pad 21 on the EEPROM chip 20 is formed in a rectangular shape in which its side 21X located in an extending direction of a bonding wire 16 is longer than its side 21Y opposed to the tip of an inner lead portion of a lead 2. The bonding pads 21 are larger in plane size than bonding pads 11 formed on the microcomputer chip 10. In comparison with the bonding pads 11 on the microcomputer chip 10, the side 21X of each bonding pad 21 on the EEPROM chip 20 located in the extending direction of a bonding wire 16 is larger than a side 11X of the bonding pad 11 located in the extending direction of the bonding wire 16.

By thus forming each bonding pad 21 on the EEPROM chip 20 in a rectangular shape wherein its side 21X located in the extending direction of a bonding wire 16 is longer than its side 21Y opposed to the tip of the inner lead portion of a lead 2, it is possible to easily effect the connection of the bonding wire 16 in accordance with the reverse bonding method. Because of reverse bonding, the bonding wire 16 has a first portion extending in a direction substantially perpendicular to a circuit-formed surface 20A of the EEPROM chip 20 and a second portion extending substantially in the direction of the circuit-formed surface 20A, the first portion being positioned not on the circuit-formed surface 20A but on the lead 2.

Although the present invention has been described concretely on the basis of the above embodiments, the invention is not limited to those embodiments, but various modifications may be made within the scope not departing from the gist of the invention.

What is claimed is:

1. A semiconductor device comprising:
   a first semiconductor chip having on one main surface thereof a control circuit, a first bonding pad, and a plurality of second bonding pads;
   a second semiconductor chip having on one main surface thereof a memory circuit and a third bonding pad and disposed on the one main surface of the first semiconductor chip, the memory circuit being controlled in accordance with a control signal generated in the control circuit on the first semiconductor chip;
   a first lead having an inner lead portion and an outer lead portion integral with the inner lead portion, the inner lead portion being disposed at a position around the first semiconductor chip;
   a plurality of second leads each having an inner lead portion and an outer lead portion integral with the inner lead portion, the inner lead portion being disposed at a position around the first semiconductor chip;
   a first bonding wire for connecting the first bonding pad on the first semiconductor chip with the inner lead portion of the first lead;
   a plurality of second bonding wires for connecting the plural second bonding pads on the first semiconductor chip with the inner lead portions of the plural second leads;
   a third bonding wire for connecting the third bonding pad on the second semiconductor chip with the inner lead portion of the first lead; and
   a resin seal member for sealing the first and second semiconductor chips, the first, second and third bonding wires, and the inner lead portions of the first and second leads,
   wherein the control signal generated in the control circuit is outputted from the first bonding pad on the first semiconductor chip and is inputted to the third bonding pad on the second semiconductor chip through the first bonding wire, the first lead and the third bonding wire.

2. A semiconductor device according to claim 1, wherein the second semiconductor chip is formed in a plane size smaller than that of the first semiconductor chip.

3. A semiconductor device according to claim 1, wherein another main surface of the second semiconductor chip opposed to the one main surface thereof is disposed on the one main surface of the first semiconductor chip so as to be facing the one main surface of the first semiconductor chip.

4. A semiconductor device according to claim 1, wherein the first and third bonding wires are connected to the same surface of the first lead.

* * * * *